United States Patent
Reese et al.

(10) Patent No.: US 11,255,024 B2
(45) Date of Patent: Feb. 22, 2022

(54) SEED LIFTING AND ROTATING SYSTEM FOR USE IN CRYSTAL GROWTH

(71) Applicant: Linton Crystal Technologies Corp., Rochester, NY (US)

(72) Inventors: John A. Reese, Spencerport, NY (US); Joel C. Stefl, Avon, NY (US)

(73) Assignee: Linton Crystal Technologies Corp., Rochester, NY (US)

( * ) Notice: Subject to any disclaimer, the term of this patent is extended or adjusted under 35 U.S.C. 154(b) by 296 days.

(21) Appl. No.: 16/444,290

(22) Filed: Jun. 18, 2019

(65) Prior Publication Data
US 2020/0399781 A1   Dec. 24, 2020

(51) Int. Cl.
| | |
|---|---|
| *C30B 15/30* | (2006.01) |
| *C30B 29/06* | (2006.01) |
| *C30B 35/00* | (2006.01) |
| *B21B 39/14* | (2006.01) |

(52) U.S. Cl.
CPC .............. *C30B 15/30* (2013.01); *C30B 29/06* (2013.01); *C30B 35/005* (2013.01); *B21B 39/14* (2013.01); *Y10S 117/911* (2013.01); *Y10T 117/1032* (2015.01)

(58) Field of Classification Search
CPC ....... C30B 15/30; C30B 15/00; C30B 35/005; Y10T 117/1032; Y10S 117/911; B21B 39/14
See application file for complete search history.

(56) References Cited

U.S. PATENT DOCUMENTS

| | | | |
|---|---|---|---|
| 4,367,199 A | 1/1983 | Jericho | |
| 4,394,352 A | 7/1983 | Helda | |
| 4,663,128 A | 5/1987 | Helgeland | |
| 4,916,955 A * | 4/1990 | Katsuoka | C30B 15/28 117/201 |
| 5,106,593 A * | 4/1992 | Mizuishi | C30B 15/30 117/215 |
| 5,582,642 A * | 12/1996 | Korb | C30B 15/30 117/200 |
| 5,702,523 A | 12/1997 | Schulmann | |
| 5,766,348 A * | 6/1998 | Schulmann | C30B 15/30 117/218 |
| 5,879,451 A * | 3/1999 | Mizuishi | C30B 15/28 117/208 |
| 5,935,328 A | 8/1999 | Cherko | |

(Continued)

FOREIGN PATENT DOCUMENTS

| | | |
|---|---|---|
| DE | 1961328 A1 | 4/1971 |
| DE | 4329283 C2 | 2/1997 |
| DE | 10007265 B4 | 8/2001 |

(Continued)

*Primary Examiner* — Matthew J Song
(74) *Attorney, Agent, or Firm* — Nixon Peabody LLP

(57) ABSTRACT

A roller guide assembly for use in lifting a seed coupled to a cable includes a mounting plate, a shaft, and a roller guide. The mounting plate has a throughhole. The shaft is coupled to the mounting plate such that the shaft is movable relative to the mounting plate in a direction that is generally perpendicular to a central axis of the shaft. The roller guide is rotationally coupled about the shaft and generally positioned within the throughhole of the mounting plate such that at least a portion of the roller guide extends out of the throughhole.

19 Claims, 20 Drawing Sheets

(56) References Cited

U.S. PATENT DOCUMENTS 6,033,472 A     3/2000  Shiraishi
6,217,648 B1 *  4/2001  Shiraishi ................. C30B 15/30
                                                        117/14

FOREIGN PATENT DOCUMENTS

DE     102004011901 A1   12/2005
DE     102009024472 A1   12/2010

* cited by examiner

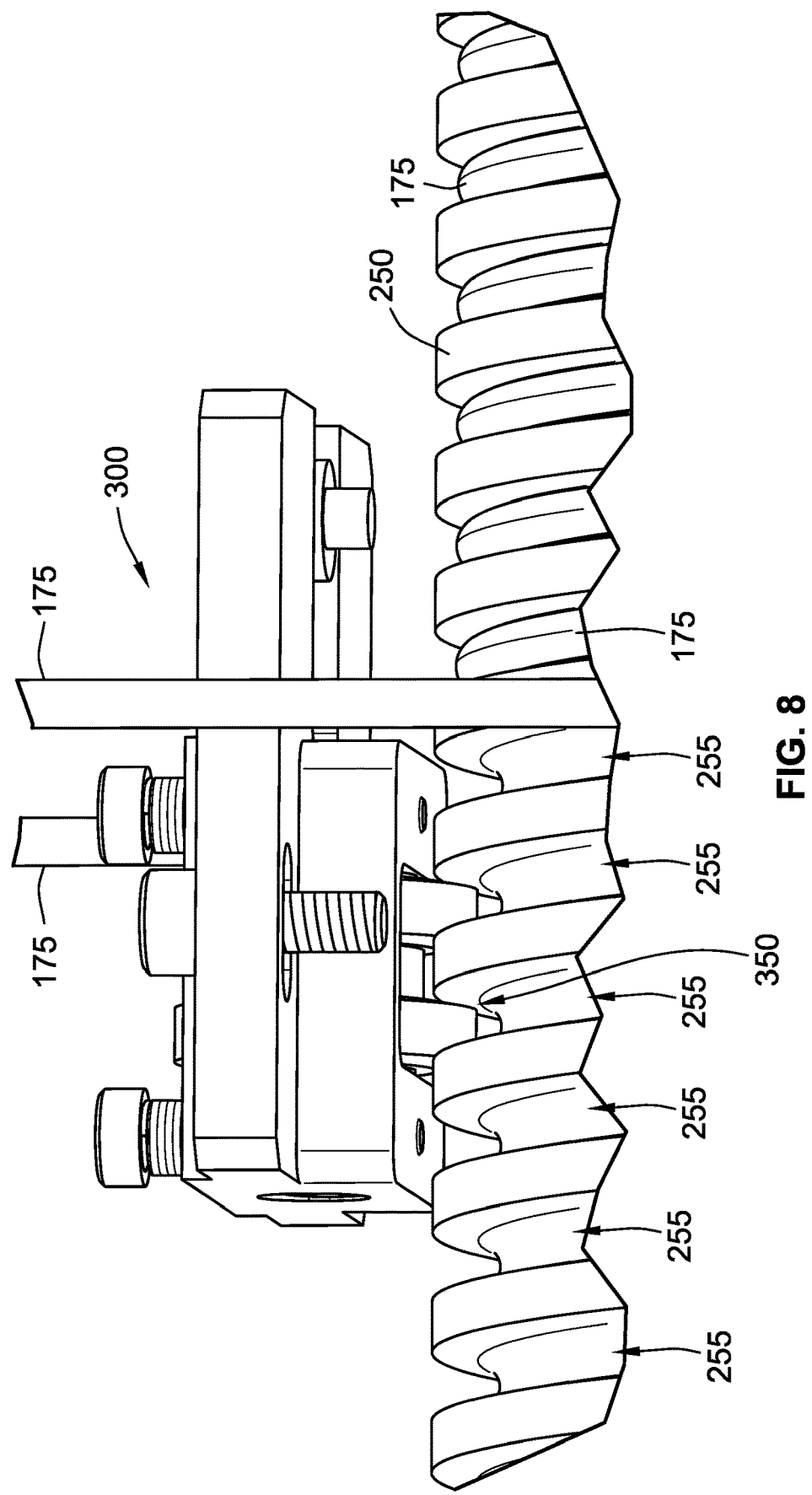

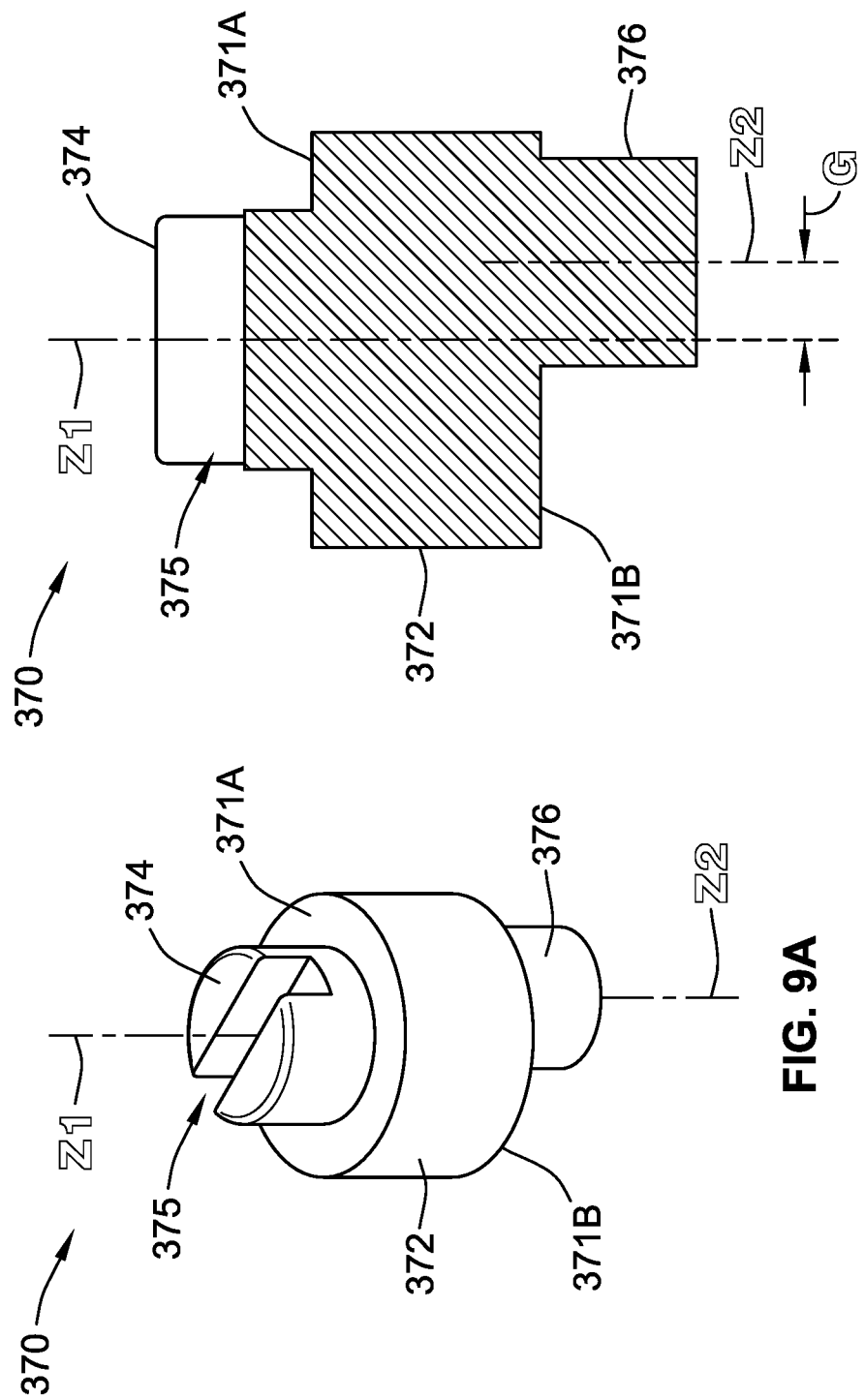

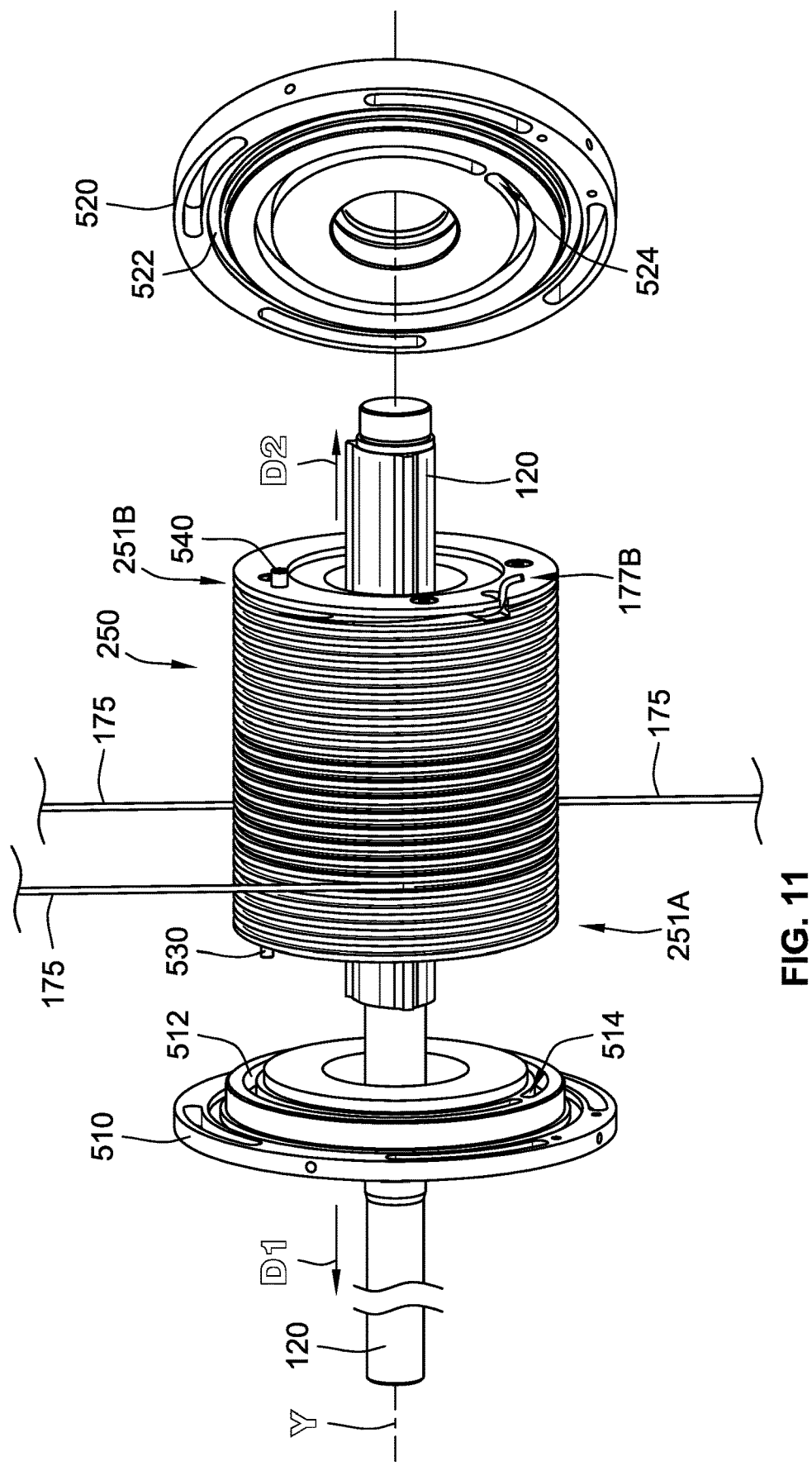

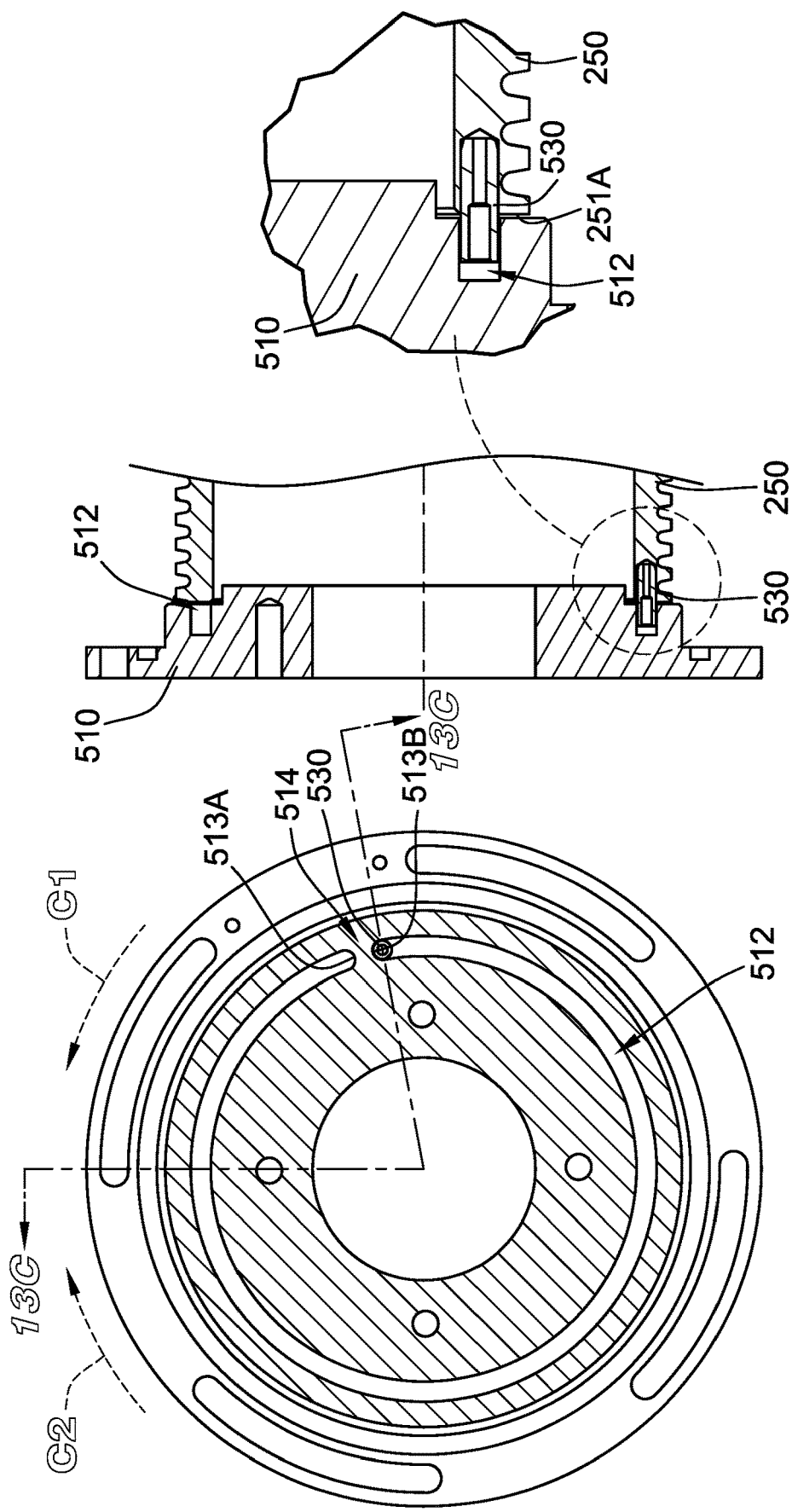

SEED LIFTING AND ROTATING SYSTEM FOR USE IN CRYSTAL GROWTH

TECHNICAL FIELD

The present disclosure relates generally to a system for use in crystal growth, and, more particularly, to a seed lifting mechanism for silicon crystal growth.

BACKGROUND

Present silicon crystal growth systems use a cable winch system that lifts and rotates a growing crystal (e.g., metalloids). Such cable winch systems include a grooved spool or drum that collects the cable in the groove as the drum is rotated. The cable winch system also translates the drum about its axis of rotation such that the cable does not touch itself during the process. The grooved drum is translated by a lead screw that engages with a lead nut, both positioned in a lift housing. The lead screw is fixed to the drum and extends from one end of the drum to engage the lead nut in a threading engagement. As such, as the drum rotates (due to a motor coupled thereto), the lead screw rotates in the lead nut. Because the lead nut has a pitched thread, the rotation of the drum causes the drum and the lead screw to translate along the axis of rotation. The length of the lead screw depends on the length of translation that is necessary to wind and/or unwind the cable a sufficient amount to grow the crystal to a desired length. Thus, the length of the lead screw increases an overall length of the cable winch system. Moreover, the cable winch system is maintained under vacuum pressure to aid in reducing contaminates from entering the growing crystal. Thus, the lead screw and lead nut further require the lift housing that encloses the lead screw, the lead nut, and the drum to be larger, and heavier. Thus, the lead screw and lead nut, which are used to convert the rotation of the drum to translation of the drum, add size and weight to the system and to the lift housing.

Thus, there is a great need for providing an alternative system to convert the rotation of the drum into translation without needlessly increasing the size and weight of the system. The present disclosure is directed towards solving this and other problems.

SUMMARY

According to some implementations of the present disclosure, a lift assembly for use in lifting a seed coupled to a cable includes a lift housing, a drum, a floating roller guide assembly, and a drive shaft. The lift housing forms a cable exit port therein. The drum is positioned within the lift housing. The drum forms a helical groove about an exterior surface of the drum. The drum extends from a first end to a second opposing end. The floating roller guide assembly includes a mounting plate, a floating shaft, and a floating roller guide. The mounting plate is coupled to the lift housing. The mounting plate has a throughhole. The floating shaft is coupled to the mounting plate such that the floating shaft is movable relative to the mounting plate in a direction that is generally perpendicular to a central axis of the floating shaft. The floating roller guide is rotationally coupled about the floating shaft and generally positioned within the throughhole of the mounting plate such that at least a portion of the floating roller guide is configured to engage at least a portion of the helical groove of the drum. The drive shaft is coupled to the drum and configured to cause (i) the drum to rotate and (ii) a translate via an engagement of the helical groove of the drum with the floating roller guide.

According to some implementations of the present disclosure, a roller guide assembly for use in lifting a seed coupled to a cable includes a mounting plate, a shaft, and a roller guide. The mounting plate has a throughhole. The shaft is coupled to the mounting plate such that the shaft is movable relative to the mounting plate in a direction that is generally perpendicular to a central axis of the shaft. The roller guide is rotationally coupled about the shaft and generally positioned within the throughhole of the mounting plate such that at least a portion of the roller guide extends out of the throughhole.

According to some implementations of the present disclosure, a lift assembly for use in lifting a seed coupled to a cable includes a lift housing a drum, a debris tray, and a brush. The drum is positioned within the lift housing. The drum forms a helical groove about an exterior surface of the drum. The debris tray is coupled to the lift housing such that at least a portion of the debris tray is positioned adjacent to a portion of the helical groove of the drum. The brush is coupled to the debris tray such that at least a portion of a plurality of bristles of the brush directly engage at least a portion of the helical groove of the drum.

According to some implementations of the present disclosure, a lift assembly for use in lifting a seed coupled to a cable includes a lift housing, a first plate, a second plate, a drum, a first anti-binding pin, and a second anti-binding pin. The first plate is coupled to a first side of the lift housing. An inner surface of the first plate forms a first slot therein. The second plate is coupled to a second opposing side of the lift housing. An inner surface of the second plate forms a second slot therein. The drum is positioned within the lift housing. The drum forms a helical groove about an exterior surface of the drum. The drum extends from a first end to a second opposing end. The first anti-binding pin is coupled to and extends from the first end of the drum and is configured to engage the first slot in the first plate to limit translation of the drum in a first linear direction. The second anti-binding pin is coupled to and extends from the second opposing end of the drum and is configured to engage the second slot in the second plate to limit translation of the drum in a second linear direction that is opposite the first linear direction.

Additional implementations and/or aspects of the present disclosure will be apparent to those of ordinary skill in the art in view of the detailed description of various implementations and/or embodiments, which is made with reference to the drawings, a brief description of which is provided below.

BRIEF DESCRIPTION OF THE DRAWINGS

FIG. 8 is a partial perspective view of the lift assembly of FIG. 3A with the lift housing removed for better illustration of the floating roller guide assembly engaging a drum of the lift assembly adjacent to a cable that is partially wound around a helical groove of the drum, according to some implementations of the present disclosure;

FIG. 9A is a perspective view of an eccentric member of the floating roller guide assembly, according to some implementations of the present disclosure;

FIG. 9B is a cross-sectional view of the eccentric member of FIG. 9A;

FIG. 11 is a partial perspective, partial exploded view of a portion of the lift assembly illustrating an anti-binding feature, according to some implementations of the present disclosure;

FIG. 12C is a cross-sectional view of the plate of FIG. 12A with the anti-binding pin (coupled to the drum) positioned therein at a third circumferential position illustrating further movement of the anti-binding pin due to rotation of the drum;

FIG. 13C is a cross-sectional view of the plate of FIG. 12C illustrating the gap between an end of the drum and the plate corresponding to the third circumferential position of the anti-binding pin.

Figure 1A:
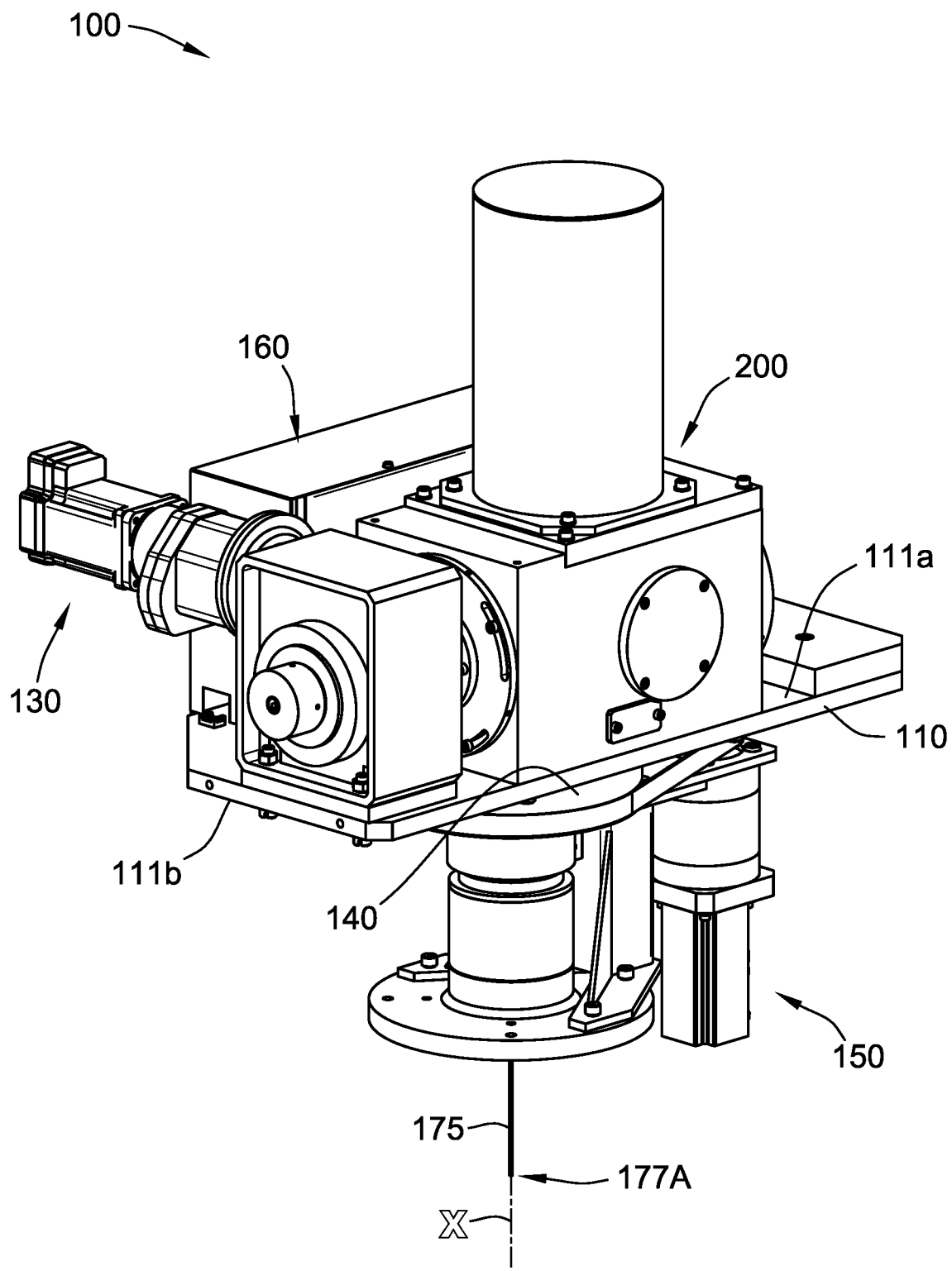
FIG. 1A is a perspective view of a seed lifting and rotating system for silicon crystal growth, according to some implementations of the present disclosure.

While the present disclosure is susceptible to various modifications and alternative forms, specific embodiments and/or implementations have been shown by way of example in the drawings and will be described in detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Figure 1B:
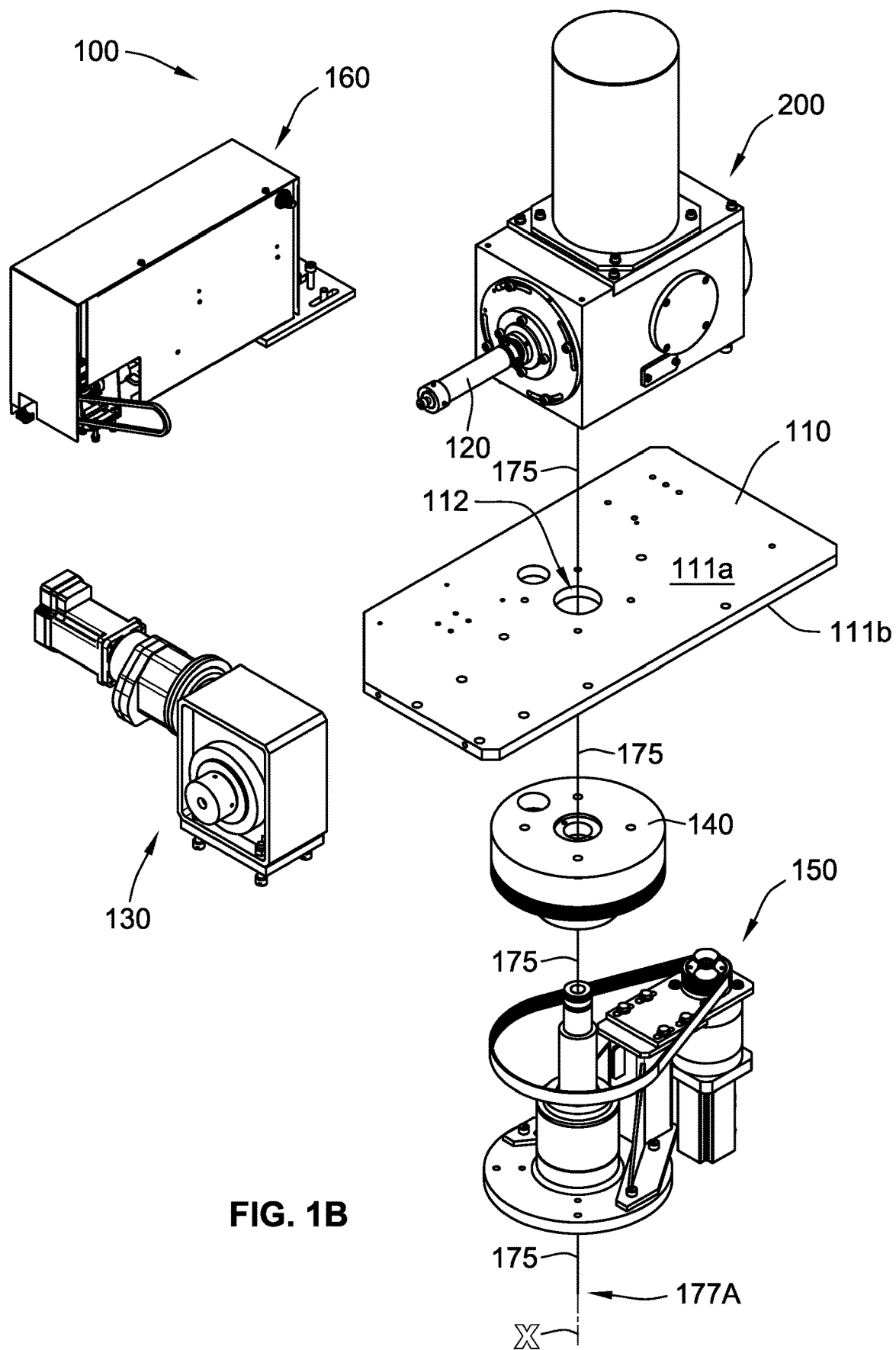
FIG. 1B is a partially exploded perspective view of the seed lifting and rotating system for silicon crystal growth of FIG. 1A.

Referring generally to FIGS. 1A and 1B, a seed lifting and rotating system 100 for use in silicon crystal growth includes a main plate 110, a drive shaft 120 (FIGS. 1B and 2B), a lift motor assembly 130, a driven rotate pulley 140, a rotate motor assembly 150, a controller assembly 160, a cable 175, and a lift assembly 200. The various components of the seed lifting and rotating system 100 are generally employed to rotate and lift a first end 177A of the cable 175 that is coupled to a seed (not shown) used to grow a crystal (e.g., silicon) using a process referred to as the Czochralski process, according to some implementations of the present disclosure.

The main plate 110 of the seed lifting and rotating system 100 forms and/or includes a cable exit port 112 (FIG. 1B) such that the cable 175 is able to pass through the main plate 110 and generally into a crucible (not shown) positioned below the seed lifting and rotating system 100. The crucible is typically filled with liquid or molten material (e.g., silicon) that interacts with the seed coupled to the first end 177A of the cable 175 to form a crystal (e.g., a single crystal of silicon) during the Czochralski process as the seed/first end 177A of the cable 175 is rotated and pulled out of the liquid or molten material.

The main plate 110 provides a mounting location for several components and/or assemblies of the seed lifting and rotating system 100 to be mounted for uniform rotation about an axis X (e.g., a vertical axis). As best shown in FIG. 1A, the lift motor assembly 130, the controller assembly 160, and the lift assembly 200 are mounted to a first side 111a of the main plate 110. As such rotation of the main plate 110 about the axis X results in a corresponding rotation of the lift motor assembly 130, the controller assembly 160, and the lift assembly 200 about the axis X.

As best shown in FIG. 1B, the drive shaft 120 (fully shown in FIG. 2B) has a first portion positioned within the lift assembly 200 and a second portion position outside of the lift assembly 200. The lift motor assembly 130 is coupled to the second portion of the drive shaft 120 such that the lift motor assembly 130 is configured to cause the drive shaft 120 to rotate about a central axis (axis Y shown in FIG. 3A) of the drive shaft 120. The rotation of the drive shaft 120 causes a corresponding rotation of a drum 250 (FIG. 2B) of the lift assembly 200 and a translation of the drum 250. As described in further detail below, the translation of the drum 250 occurs due to an engagement of the drum 250 with a floating roller guide assembly 300 (best shown in FIGS. 5A and 5B) of the lift assembly 200.

Mounted to a second opposing side 111B of the main plate 110 is the driven rotate pulley 140 (FIGS. 1A and 1B). The driven rotate pulley 140 is coupled to the rotate motor assembly 150 such that the rotate motor assembly 150 is able to rotate the driven rotate pulley 140 about the axis X. The axis X is collinear or generally collinear with a central axis of a portion of the cable 175 that extends in a generally vertical direction (e.g., at least the portion of the cable 175 that extends below the rotate motor assembly 150). As the driven rotate pulley 140 rotates about the axis X, the main plate 110 and everything coupled thereto (e.g., the drive shaft 120, the lift motor assembly 130, the controller assembly 160, the lift assembly 200, and the cable 175) also rotates about the axis X. That is, the rotation of the driven rotate pulley 140 results in a corresponding rotation of the cable 175 and its first end 177A with the attached seed about the axis X. Such rotation is used in the method for growing a crystal (e.g., a silicon crystal).

The controller assembly 160 includes one or more processors, one or more memory devices, one or more batteries, one or more other electronic components, or any combination thereof, such that the controller assembly 160 is able to control the operation of the seed lifting and rotating system 110 or any portion(s) thereof. For example, the controller assembly 160 is operable to cause the lift motor assembly 130 to start and stop in two opposing rotational directions, thereby raising and/or lowering the seed relative to Earth/the floor. For another example, the controller assembly 160 is able to cause the rotate motor assembly 150 to start and stop in two opposing rotational directions, thereby rotating the seed about the axis X in one or two opposing directions (e.g., clockwise and/or counterclockwise).

Figure 2A:
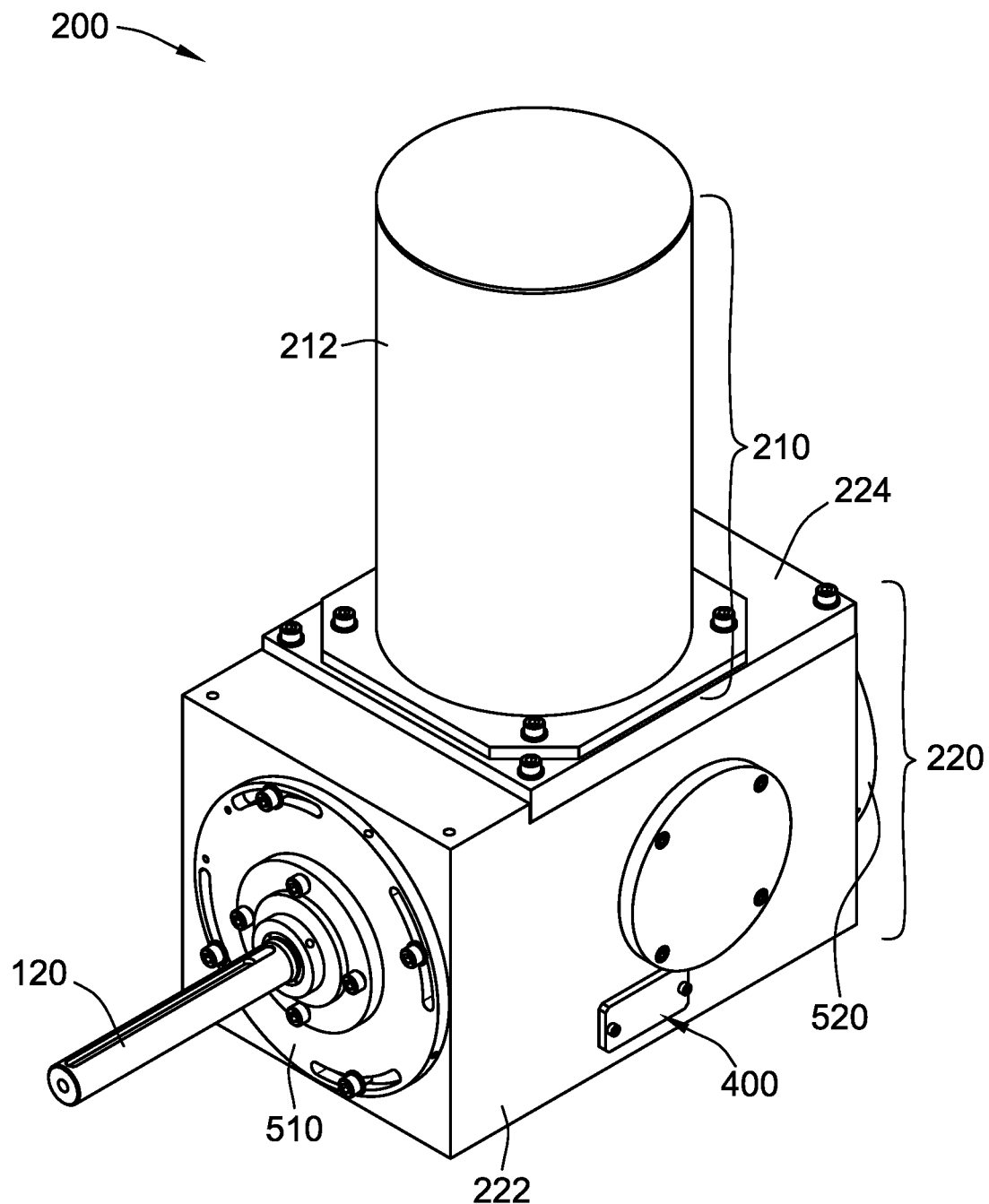
FIG. 2A is an assembled perspective view of a lift assembly of the seed lifting and rotating system of FIG. 1A.
Figure 2B:
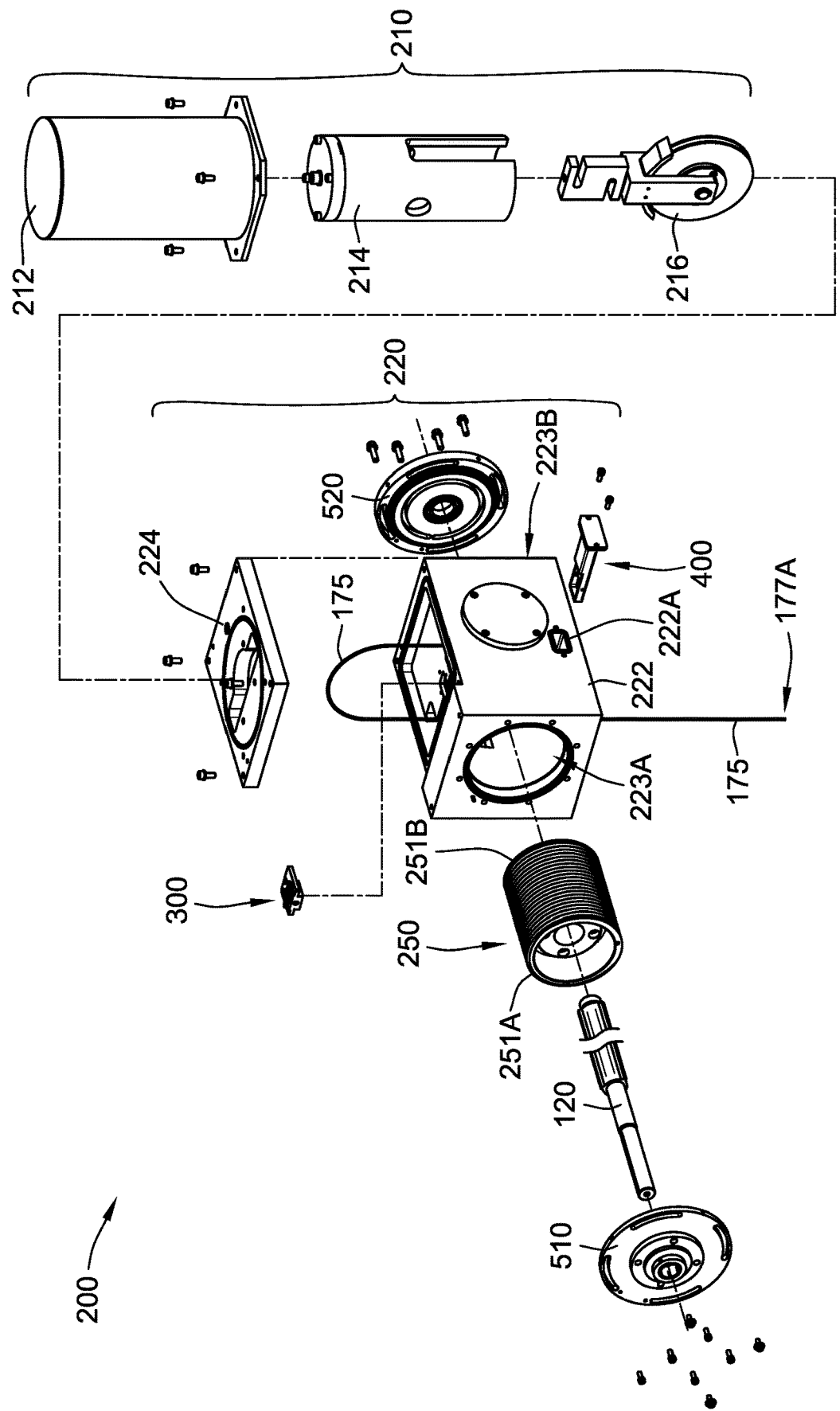
FIG. 2B is a partially exploded perspective view of the lift assembly of FIG. 2A.

Referring to FIGS. 2A and 2B, the lift assembly 200 includes a pulley assembly 210 coupled to a lift housing 220. The lift assembly 200 is illustrated with the drive shaft 120 coupled thereto. The drive shaft 120 can be considered as part of the lift assembly 200 or separate from the lift assembly 200 and coupled thereto.

Referring to FIG. 2B, the pulley assembly 210 includes a pulley housing 212, a pulley support structure 214, and a lift pulley 216. The lift pulley 216 is mounted (e.g., via one or more intermediate components) to the pulley support structure 214 and covered by the pulley housing 212. The pulley housing 212 is coupled to the lift housing 220 to aid in keeping debris and/or contaminants out of the seed lifting and rotating system 100.

The lift pulley 216 has a circumferentially extending groove. The lift pulley 216 is positioned in the pulley housing 212 such that (i) a first portion of the circumferentially extending groove of the lift pulley 216 aligns with a portion of a helical groove 255 (best shown in FIG. 8) of the drum 250 and (ii) a second portion of the circumferentially extending groove of the lift pulley 216 aligns with a cable exit port 221 (shown in FIG. 3B) of the lift housing 220. That is, referring to FIGS. 3B and 2B, during operation of seed lifting and rotating system 100, a portion of the cable 175 extends from the drum 250 (e.g., generally vertically therefrom) and wraps around the circumferentially extending groove of the lift pulley 216 and extends down through the cable exit port 221 (FIG. 3B). As such, the lift pulley 216 aids in guiding the cable 216 to the cable exit port 112 of the main plate 110 and the cable exit port 221 of the lift housing 220 while also aiding in preventing the cable 175 from touching itself.

Referring to FIG. 2B, the lift housing 220 includes a main housing 222 and a lid 224. The main housing 222 is monolithic (e.g., formed as a solid part) to aid in a rigidity of the lift assembly 200. In some implementations, the internal portions of the seed lifting and rotating system 100 are maintained under vacuum pressure to, for example, aid in debris reduction in the seed lifting and rotating system 100. As such, having a monolithic main housing 222 aids in reducing unnecessary joints that require seals and that are more prone to leakage as compared to a monolithic structure. Alternatively, the main housing 222 can be formed from two or more parts coupled together (e.g., via welding, fasteners, etc. or any combination thereof).

The lift housing 220 forms the cable exit port 221 therein that aligns with the cable exit port 112 (FIG. 1B) of the main plate 110 when the lift housing assembly 200 is mounted on the main plate 110 (FIG. 1A). The lift housing 220 also forms a first opening 223A (FIG. 2B) in a first side of the lift housing 220 and a second opening 223B (hidden) in a second opposing side of the lift housing 220. The second opening 223B, although hidden in the drawings, is generally a mirror of the first opening 223A, although various differences between the first and second openings 223A, 223B are contemplated.

During operation of the seed lifting and rotating system 100, the drum 250 (FIG. 2B) is positioned within the lift housing 220. As best shown in FIGS. 3B, 8, and 11, the drum 250 has the helical groove 255 about an exterior surface of the drum 250. Referring to FIG. 11, the drum 250 extends from a first end 251A to a second opposing end 251B. The helical groove 255 extends from the first end 251A of the drum 250 to the opposing second end 251B of the drum 250. Alternatively, the helical groove 255 can extend for any portion or portions of the drum 250 (e.g., for 50% of the length of drum 250, for 60% of the length of the drum 250, for 75% of the length of the drum 250, for 85% of the length of the drum 250, for 95% of the length of the drum 250, etc. or any other amount).

The cable 175 is generally wrapped about the drum and 250 and partially positioned in the helical groove 255 of the drum 250 (FIG. 11). As such, the winding and unwinding of the cable 175 about the drum 250 occurs without the cable 175 touching itself and/or crossing over itself. The cable 175 has the first end 177A (FIGS. 1A, 1B, 2B) and an opposing second end 177B (FIG. 11). As described above, the first end 177A of the cable 175 is configured to be coupled to a seed (not shown) for use in silicon crystal growth. The opposing second end 177B of the cable 175 is fixed to the drum 250 (FIG. 11).

During operation of the seed lifting and rotating system 100, a first portion of the cable 175 is disposed within a portion of the helical groove 255 of the drum 250 (FIG. 11), a second portion of the cable 175 extends from the helical groove 255 of the drum 250 and is at least partially positioned within the circumferentially extending groove of the lift pulley 216 (FIG. 2B), and a third portion of the cable 175 extends from the circumferentially extending groove of the lift pulley 216 and passes through the cable exit port 221 of the lift housing 220 (FIG. 3B) and the cable exit port 112 (FIG. 1B) of the main plate 110.

Referring back to FIG. 2B, the lift assembly 200 includes the floating roller guide assembly 300, which is exploded from the main housing 222 and described in further detail herein. Further, the lift assembly 200 includes a debris tray assembly 400, which is exploded from the main housing 222 and described in further detail herein. Further, the lift assembly 200 includes an anti-binding feature that includes two plates 510, 520 (FIG. 2B) coupled to the main housing 222 and two anti-binding pins 530, 540 (best shown in FIG. 11) coupled to and extending from the drum 250, the plates 510, 520 and the drum 250 being exploded from the main housing 222 (FIG. 2B) and described in further detail herein.

Referring generally to FIGS. 3A-9B, the floating roller guide assembly 300 and its various components are illustrated in assembled and exploded views to further illustrate the function and structure of the floating roller guide assembly 300. The floating roller guide assembly 300 is coupled to an internal shelf 225 (FIGS. 3A-4B) of the main housing 222 of the lift assembly 200. As best shown in FIGS. 3B and 8, the floating roller guide assembly 300 is coupled to the main housing 222 (FIG. 3B) such that the floating roller guide assembly 300 is positioned in engagement with the drum 250. As such, rotation of the drum 250 (caused by its engagement with the drive shaft 120) causes the helical groove 255 (FIG. 8) of the drum 250 to engage with the floating roller guide assembly 300 (which is fixed to the lift housing 220). Such engagement causes the drum 250 to translate (e.g., move) along its central axis Y (FIGS. 3A, 3B) and along the drive shaft 120.

As best shown in FIGS. 5A, 5B, 6A, and 6B, the floating roller guide assembly 300 includes a mounting plate 310, a floating shaft 330, a floating roller guide 350, an eccentric member 370, bolts 380A, 380B, springs 390A, 390B, and fasteners 395A, 395B. Collectively, the components of the floating roller guide 300 aid in converting rotation of the drum 250 into translation of the drum 250. The term "floating" is generally used to indicate that the component can move relative to the mounting plate 310. For example, the floating shaft 330 can move relative to the mounting plate 310 when coupled thereto as described in further detail below.

Figure 3A:
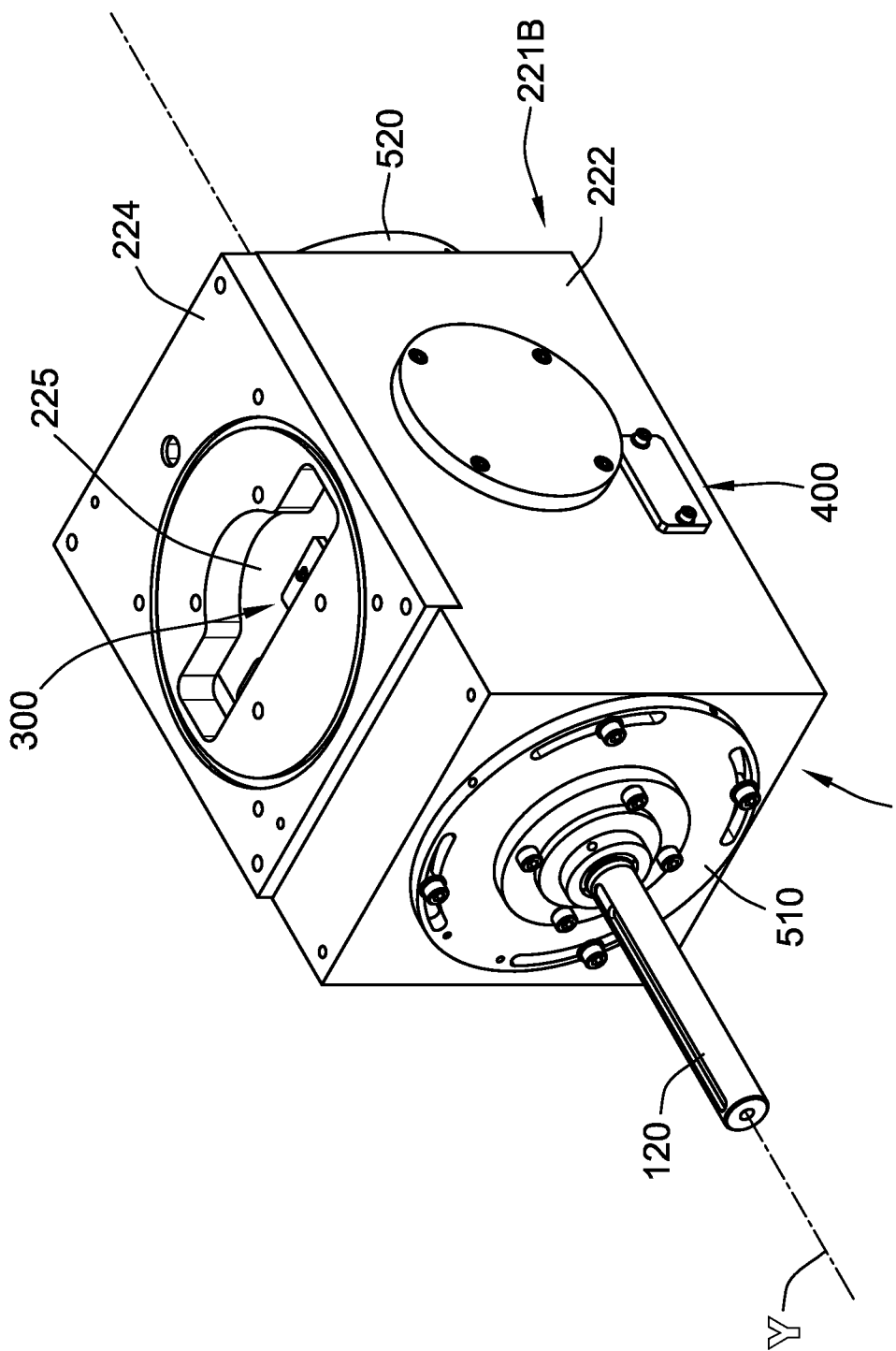
FIG. 3A is a partial perspective view of the lift assembly of FIG. 2A with a pulley assembly removed for better illustration.
Figure 3B:
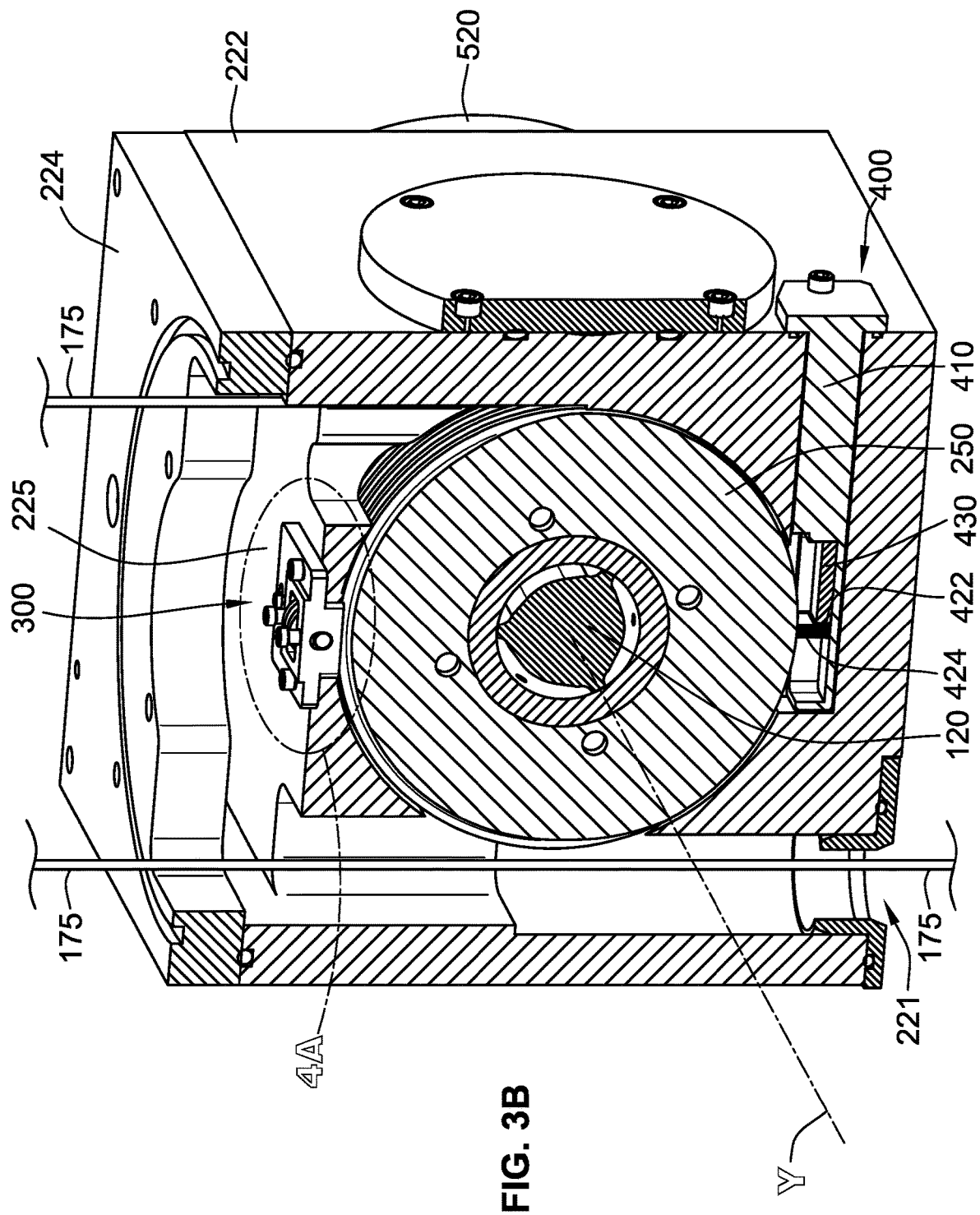
FIG. 3B is a cross-sectional view of the partial perspective view of the lift assembly of FIG. 3A.
Figure 4A:
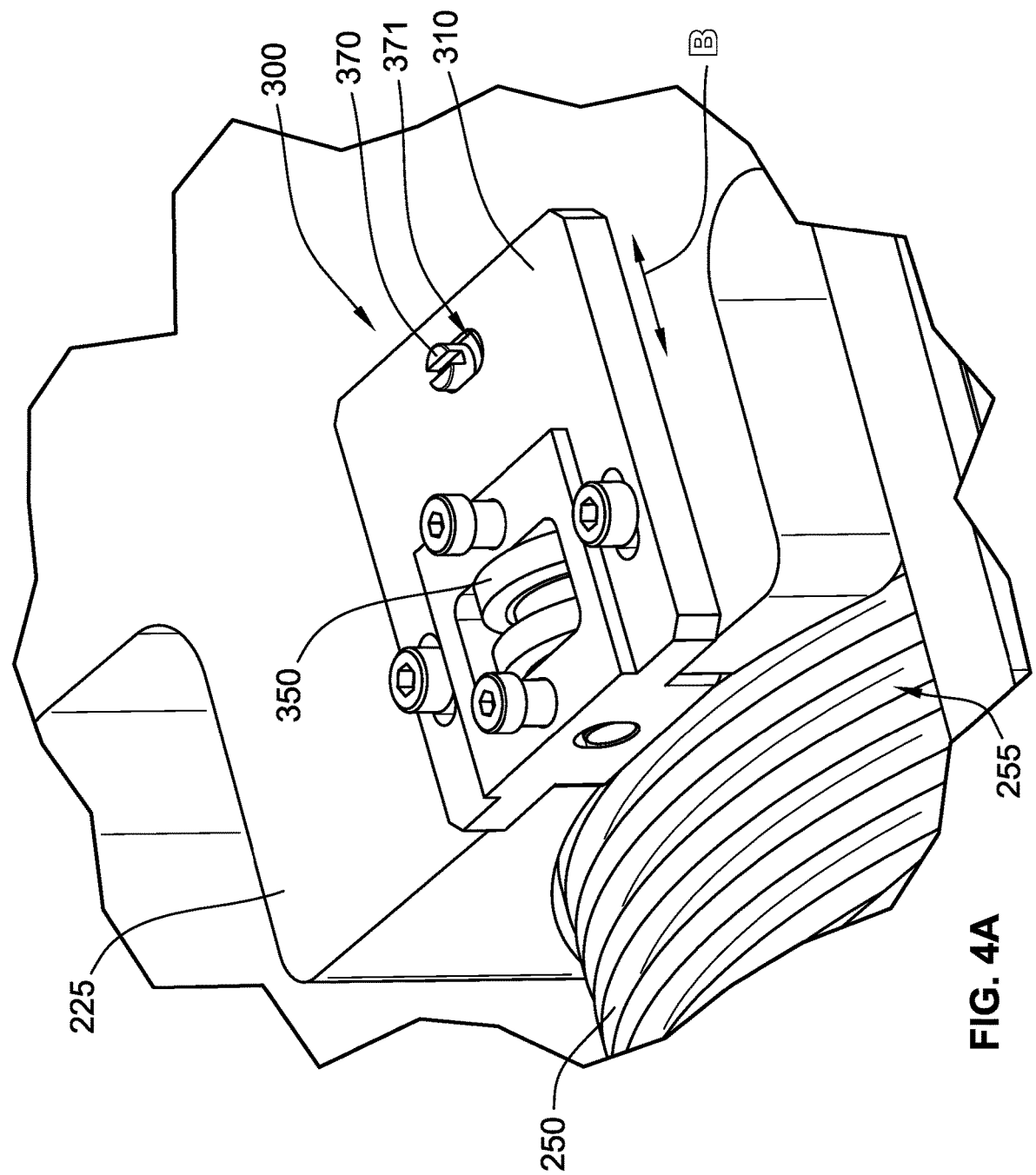
FIG. 4A is an assembled perspective view of a floating roller guide assembly of the lift assembly, according to some implementations of the present disclosure.
Figure 4B:
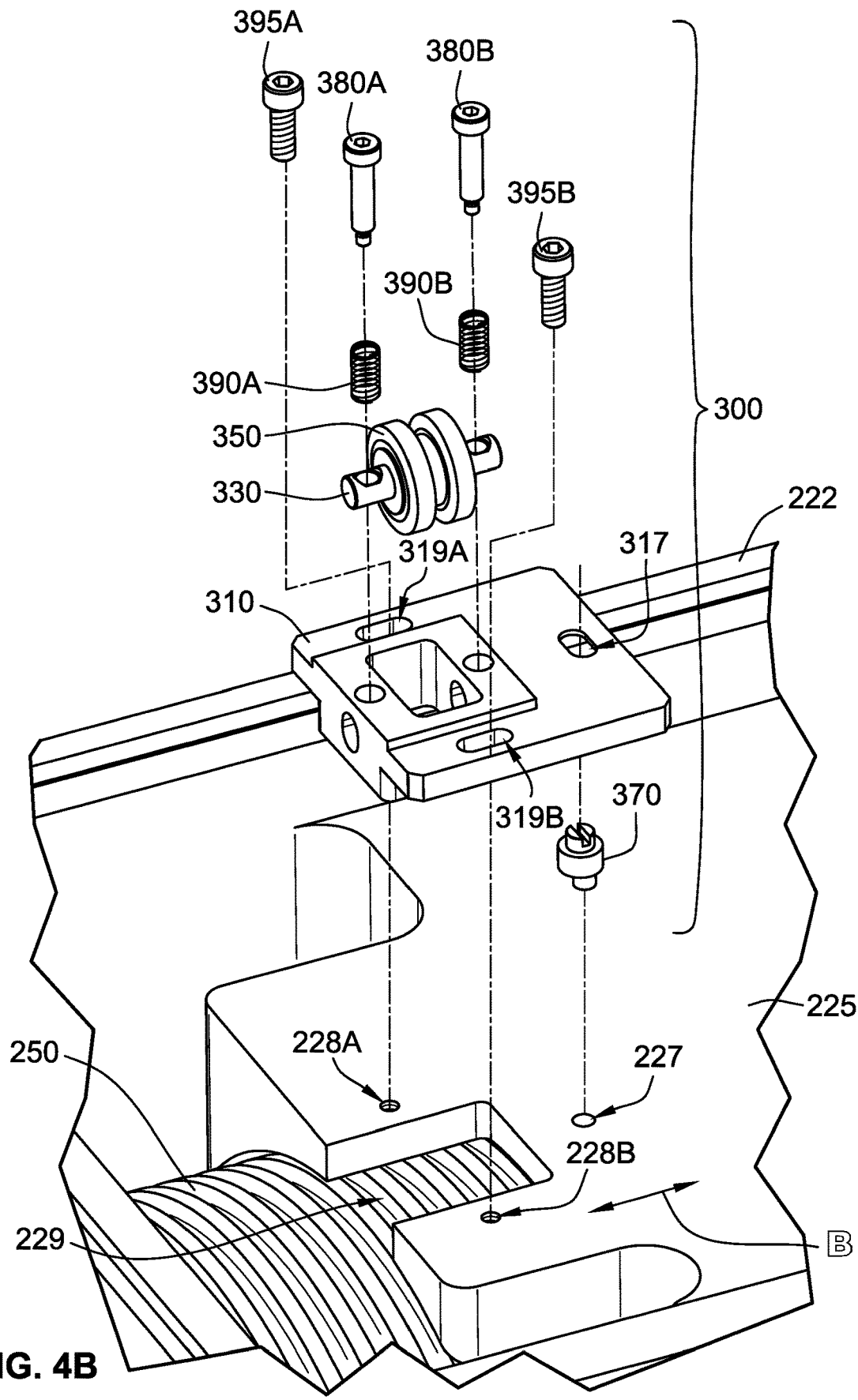
FIG. 4B is an exploded perspective view of the floating roller guide assembly of FIG. 4A.
Figure 5A:
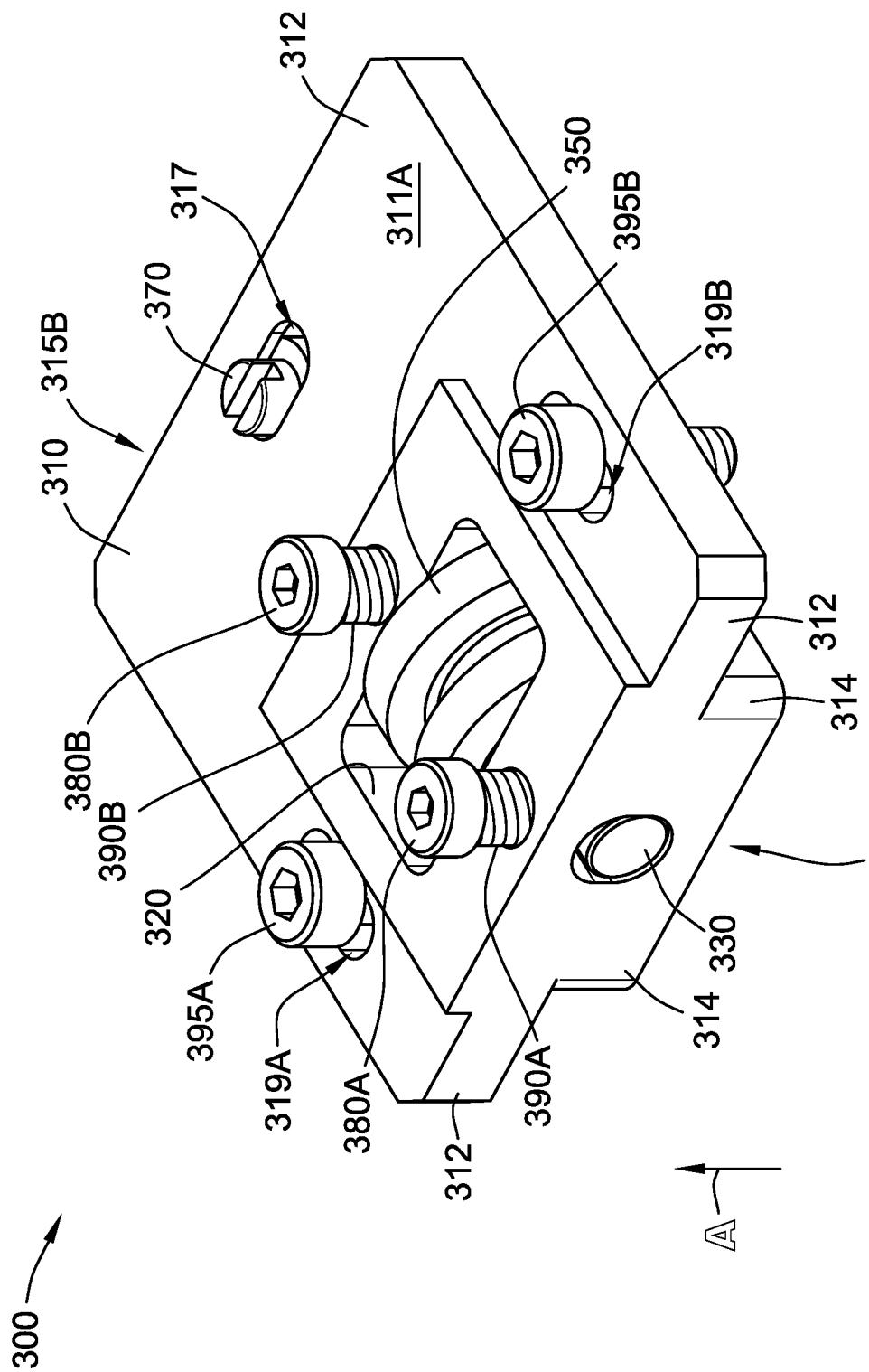
FIG. 5A is a first assembled perspective view of the floating roller guide assembly of FIG. 4A removed from the lift housing for better illustration.
Figure 5B:
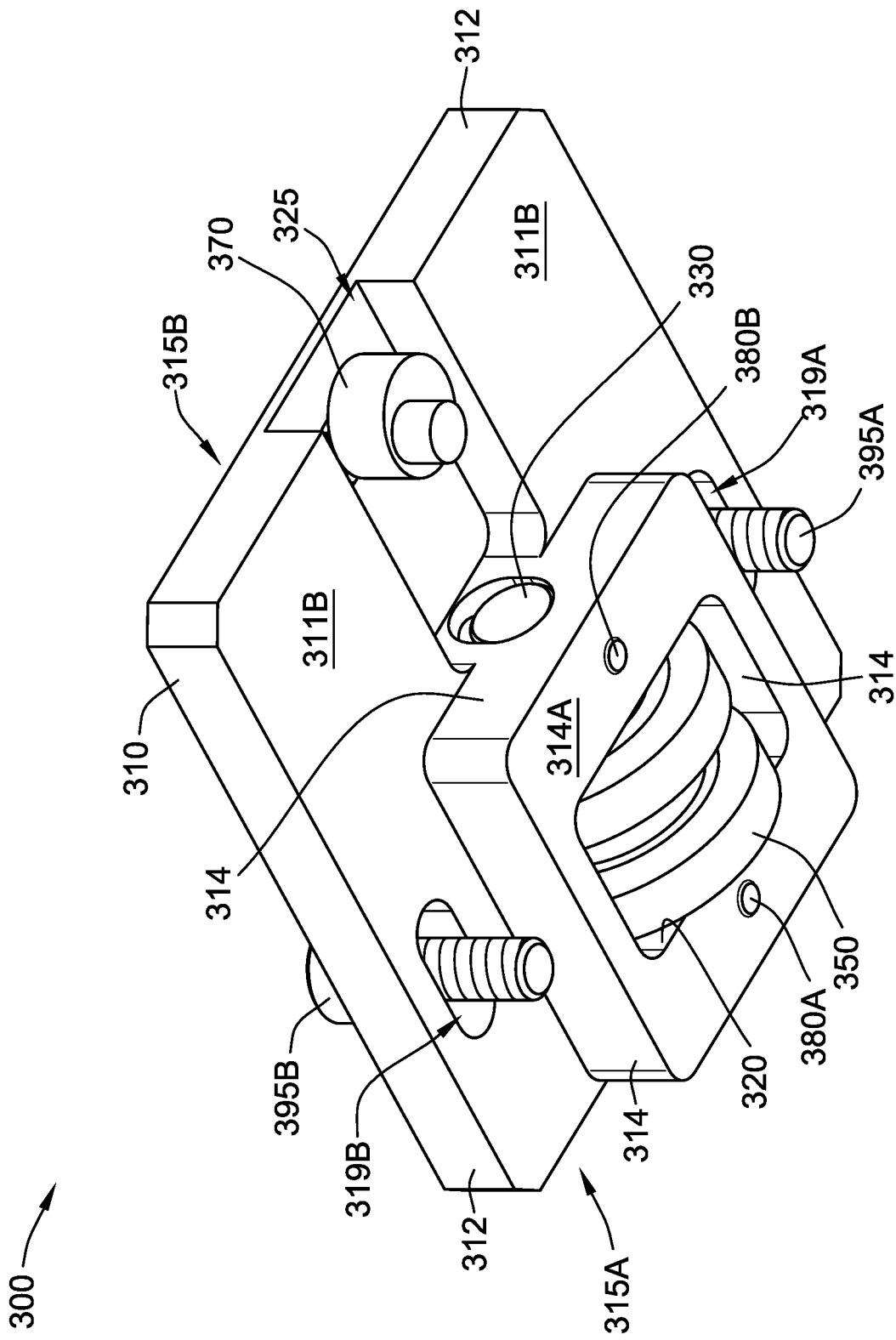
FIG. 5B is a second assembled perspective view of the floating roller guide assembly of FIG. 4A removed from the lift housing for better illustration.

The mounting plate 310 is removably connected to the internal shelf 225 of the main housing 222 via the fasteners 395A, 395B, which is best shown in FIGS. 3B and 4A. Referring to FIGS. 5A and 5B, the mounting plate 310 has a main body 312 and a projection 314. The main body 312 has a first surface 311A (FIG. 5A) and a second opposing surface 311B (FIG. 5B). The projection 314 extends from the second opposing surface 311B of the main body 312 adjacent to a first end 315A of the mounting plate 310.

A throughhole 320 (best shown in FIGS. 6A and 6B) of the mounting plate 310 is formed through the main body 312 and the projection 314. The throughhole 320 has a generally rectangular cross-section, although any shaped cross-section is contemplated such that the floating roller guide 350 can be positioned therein.

A slot 325 (best shown in FIGS. 5B and 6B) of the mounting plate 310 is formed in the main body 312 of the mounting plate 310 adjacent to a second opposing end 315B of the mounting plate 310. The slot 325 extends from the second opposing surface 311B of the main body 312 towards the first surface 311A of the main body 312.

Figure 6A:
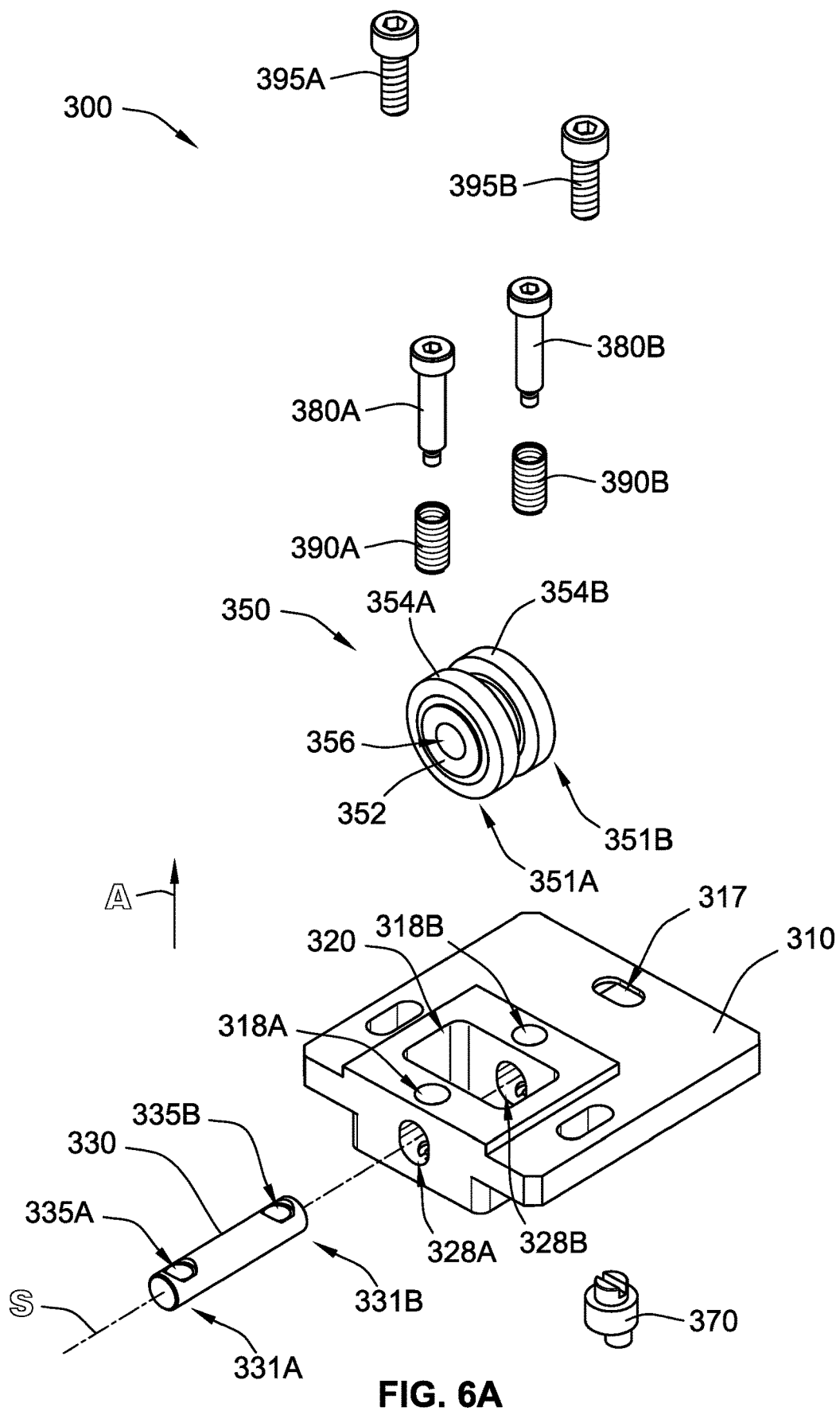
FIG. 6A is a first exploded perspective view of the floating roller guide assembly of FIG. 4A removed from the lift housing for better illustration.
Figure 6B:
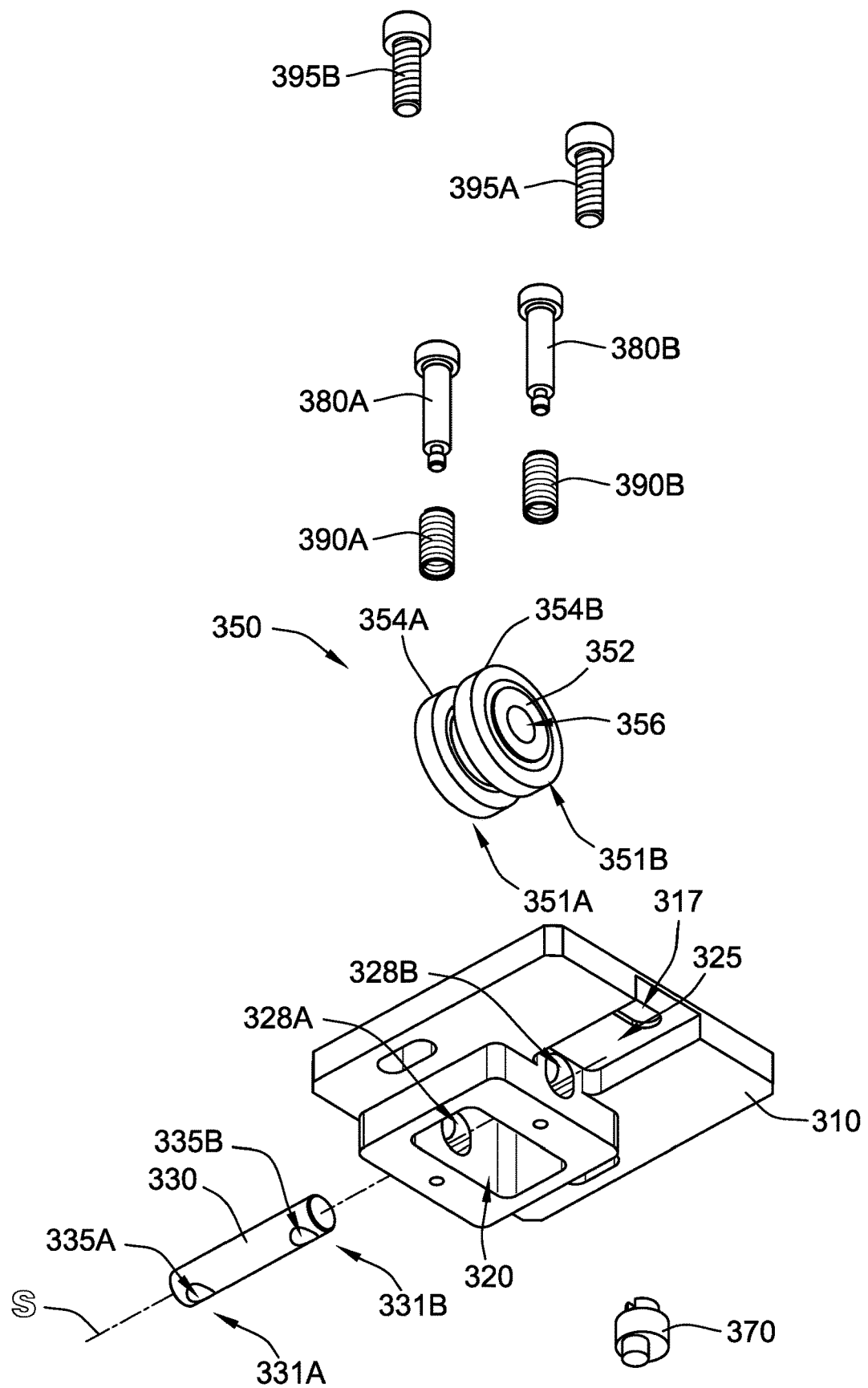
FIG. 6B is a second assembled perspective view of the floating roller guide assembly of FIG. 4A removed from the lift housing for better illustration.

The floating shaft 330 is coupled to the mounting plate 310 such that the floating shaft 330 is movable relative to the mounting plate 330 in a direction of arrow A (FIGS. 5A and 6A) that is generally perpendicular to a central axis S (FIGS. 6A and 6B) of the floating shaft 330. As best shown in FIGS. 6A and 6B, the mounting plate 310 includes a pair of oblong bores 328A, 328B into which the floating shaft 330 is positioned. A height of the oblong bores 328A, 328B is greater than a diameter of the floating shaft 330, which provides space for the floating shaft 330 to move up and/or down within the oblong bores 328A, 328B. In some implementations, the height of the oblong bores 328A, 328B is at least about 5 percent greater than a diameter and/or height of the floating shaft 330, at least about 10 percent greater than the diameter and/or the height of the floating shaft 330, at least about 20 percent greater than the diameter and/or the height of the floating shaft 330, at least about 30 percent greater than the diameter and/or the height of the floating shaft 330, at least about 50 percent greater than the diameter and/or the height of the floating shaft 330, or any other amount such that the floating shaft 330 is movable within the oblong bores 328A, 328B.

The floating shaft 330 has a first throughhole 335A (FIGS. 6A, 6B, 7) that is formed in a first end 331A of the floating shaft 330 and a second throughhole 335B (FIGS. 6A, 6B, 7) that is formed in a second opposing end 331B of the floating shaft 330. A central axis of the first throughhole 335A and a central axis of the second throughhole 335B are both generally perpendicular to the central axis of the floating shaft 330.

Figure 7:
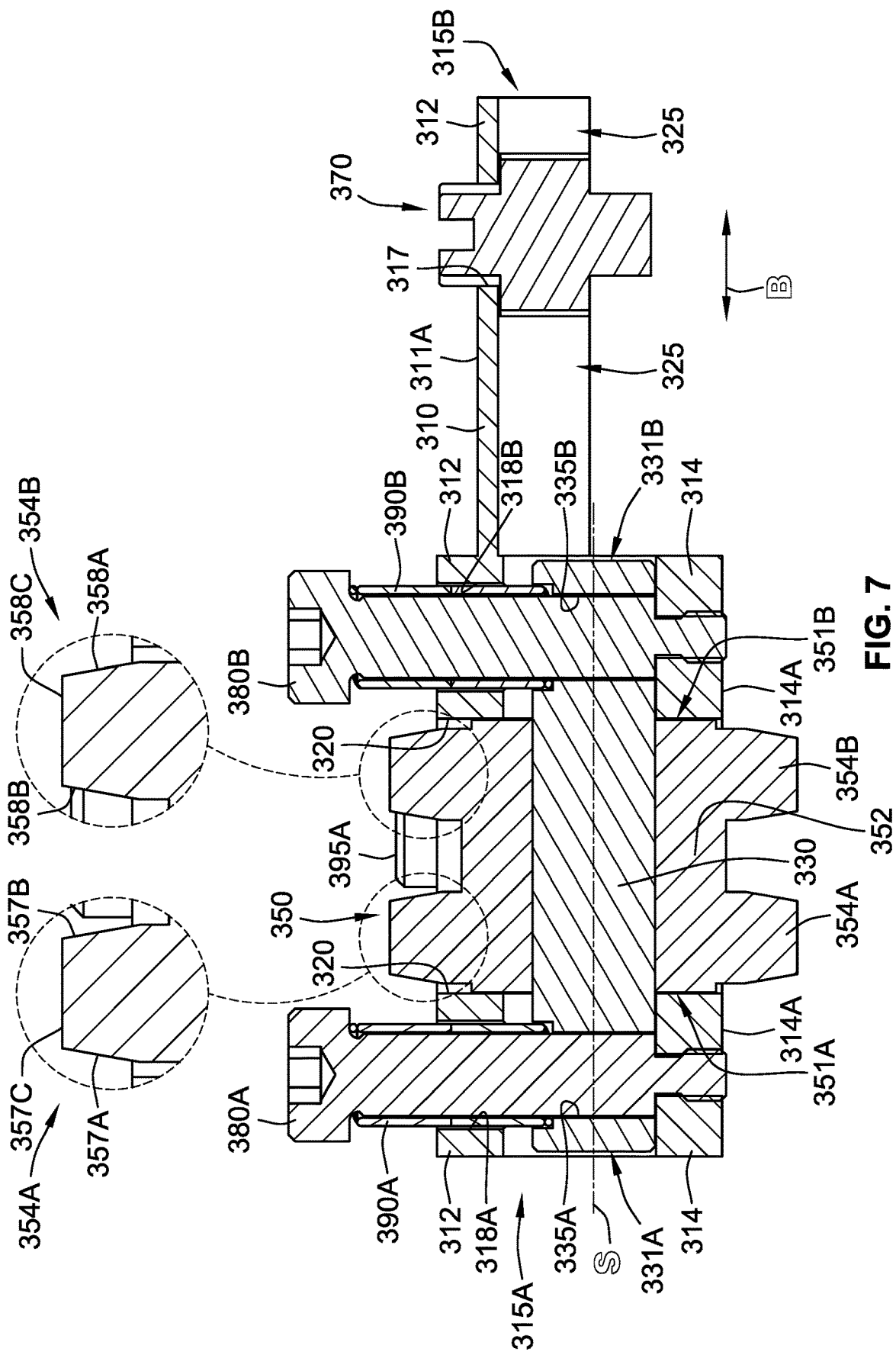
FIG. 7 is a cross-sectional view of the floating roller guide assembly of FIG. 4A removed from the lift housing for better illustration.

As best shown in FIGS. 5A, 5B, 6A, and 7, the first bolt 380A is positioned through a first bore 318A (FIG. 6A) in the mounting plate 310 and through the first throughhole 335A of the floating shaft 330 and coupled to the projection 314 of the mounting plate 310 (best shown in FIG. 7). The first bolt 380A is coupled to the projection 314 via a threaded connection, although other connection types are contemplated (e.g., press fit, Morse taper, glue, welded, etc. or any combination thereof). The first bore 318A extends from the first surface 311A into the first oblong bore 328A. The first spring 390A is positioned about a shaft of the first bolt 380A such that the first spring 390A bias the first end 331A of the floating shaft 330 towards an end surface 314A (FIGS. 5B and 7) of the projection 314 of the mounting plate 310 (e.g., in a vertically downward direction).

Similarly, as best shown in FIGS. 5A, 5B, 6A, and 7, the second bolt 380B is positioned through a second bore 318B (FIG. 6A) in the mounting plate 310 and through the second throughhole 335B of the floating shaft 330 and coupled to the projection 314 of the mounting plate 310 (best shown in FIG. 7). The second bolt 380B is coupled to the projection 314 via a threaded connection, although other connection types are contemplated (e.g., press fit, Morse taper, glue, welded, etc. or any combination thereof). The second bore 318B extends from the first surface 311A into the second oblong bore 328B. The second spring 390B is positioned about a shaft of the second bolt 380B such that the second spring 390B bias the second end 331B of the floating shaft 330 towards the end surface 314A (FIGS. 5B and 7) of the projection 314 of the mounting plate 310 (e.g., in a vertically downward direction).

In some implementations, one or both of the bolts 380A, 380B can be adjusted to modify the biasing force exerted on the floating shaft 330 by the springs 390A, 390B. For example, the bolts 380A, 380B can be screwed or pushed or moved further into the mounting plate 310 towards the end surface 314A to further compress the springs 390A, 390B, thereby resulting in a greater biasing force. In some implementations, the spring constant(s) of the first and second springs 390A, 390B can be changed to modify the biasing force on the floating shaft 330.

The floating roller guide 350 is rotationally coupled about the floating shaft 330 (best shown in FIGS. 4B and 7) such that the floating roller guide 350 can rotate about the floating shaft 330. The floating roller guide 350 is generally positioned within the throughhole 320 (best shown in FIGS. 5A, 5B, and 7) of the mounting plate 310 such that at least a portion of the floating roller guide 350 extends outside of the throughhole 320 and is configured to engage at least a portion of the helical groove 355 of the drum 350 (shown in FIG. 8).

Referring to FIGS. 6A and 6B, the floating roller guide 350 has a generally cylindrical body 352, a first wheel portion 354A, and a second wheel portion 354B. The generally cylindrical body 352 forms a throughbore 356 such that the floating shaft 330 can pass through and carry the floating roller guide 350. As such, the floating roller guide 350 is able to rotate about the floating shaft 330.

The first wheel portion 354A is positioned about a first end 351A of the generally cylindrical body 352 and integral therewith (as best shown in FIG. 7). The second wheel portion 354B is positioned about a second opposing end 351B of the generally cylindrical body 352 and integral therewith (as best shown in FIG. 7). That is, the floating roller guide 350 is a monolithic part. Alternatively, the floating roller guide 350 can be formed by two or more parts coupled together via, for example, welding, glue, press fitting, Morse taper connections, etc. or any combination thereof.

Referring to FIG. 7, the first wheel portion 354A of the floating roller guide 350 has an outer side-surface 357A, an inner side-surface 357B, and a perimeter surface 357C. Similarly, the second wheel portion 354B has an outer side-surface 358A, an inner side-surface 358B, and a perimeter surface 358C. The first and second wheel portions 354A, 354B are arranged such that the inner side-surface 357B of the first wheel portion 354A faces the inner side-surface 358B of the second wheel portion 354B.

A portion of the inner side-surface 357B of the first wheel portion 354A is outwardly tapered from the perimeter surface 357C of the first wheel portion 354A towards the generally cylindrical body 352 of the floating roller guide 350. Similarly, a portion of the inner side-surface 358B of the second wheel portion 354B is outwardly tapered from the perimeter surface 358C of the second wheel portion 354B towards the generally cylindrical body 352 of the floating roller guide 350.

Additionally, a portion of the outer side-surface 357A of the first wheel portion 354A is outwardly tapered from the perimeter surface 357C of the first wheel portion 354A towards the generally cylindrical body 352 of the floating roller guide 350. Similarly, a portion of the outer side-surface 358A of the second wheel portion 354B is outwardly tapered from the perimeter surface 358C of the second wheel portion 354B towards the generally cylindrical body 352 of the floating roller guide 350.

The shape of the first and second wheel portions 354A, 354B aids in the floating roller guide 350 engaging the helical groove 255 of the drum 250 (FIG. 8). In some implementations, the shape of the first and second wheel portions 354A, 354B of the floating roller guide 350 correspond to a shape of the helical groove 255 or a portion of the helical groove 255 that the floating roller guide 350 engages (e.g., directly touches). Other shapes for the engaging surfaces of the floating roller guide 350 and the helical groove 255 are contemplated (e.g., curved, rounded, flat, angled, stepped, etc., or any combination thereof).

Referring to FIGS. 9A and 9B, the eccentric member 370 is operable to move and/or adjust a relative position of the floating roller guide assembly 300 (FIG. 4A) to adjust a position of the floating roller guide 350. By adjusting a location of the floating roller guide 350, the helical groove 255 of the drum 250 is engaged and also moved in a corresponding fashion. This is because of the connection/coupling between the floating roller guide 350 and the helical groove 255 as best shown in FIG. 8. As such, the floating roller guide assembly 300 can be adjusted to align the helical groove 255 of the drum 250 with the circumferentially extending groove of the pulley 216 (FIG. 2B). The alignment of the circumferentially extending groove of the pulley 216 with the helical groove 255 of the drum 250 is important to aid in preventing the cable 175 from rubbing on the sides of the circumferentially extending groove of the pulley 216 as the cable 175 extends into and about the circumferentially extending groove of the pulley 216 from the helical groove 255 of the drum 250 during operation. A misalignment of the helical groove 255 and the circumferentially extending groove of the pulley 216 can cause unwanted vibration in the seed lifting and rotating system 100.

The eccentric member 370 of the floating roller guide assembly 300 has a main body 372, a first generally cylindrical post 374, and a second generally cylindrical post 376. The eccentric member 370 is a monolithic part, however, the eccentric member 370 can be formed by two or more parts and coupled together (e.g., via welding, glue, fasteners, etc., or any combination thereof). The eccentric member 370 is made from plastic, however, the eccentric member 370 can be made from any material (e.g., metal, plastic, etc., or any combination thereof).

The first generally cylindrical post 374 extends from a first surface 371A of the main body 372. The second generally cylindrical post 376 extends from a second opposing surface 371B of the main body 372. A central axis Z1 of the first generally cylindrical post 374 is offset by a distance G from a central axis Z2 of the second generally cylindrical post 376. As such, the eccentric member 370 has an eccentric shape.

The first generally cylindrical post 374 includes a slot 375 that aids in rotating the eccentric member 370 about the central axis Z2. In some implementations, a tool such as a flathead screw driver (not shown) can be used to engage the slot 375 and move and/or rotate the eccentric member 370.

During operation of the floating roller guide assembly 300, the main body 372 of the eccentric member 370 is positioned with in the slot 325 (best shown in FIGS. 5B and 7) of the mounting plate 310. The slot 325 is sized and shaped such that the main body 372 of the eccentric member 370 is able to move (e.g., rotate, slide, etc.) within the slot 325 without touching other elements of the floating roller guide assembly 300 (e.g., the floating shaft 330).

During operation of the floating roller guide assembly 300, the first generally cylindrical post 374 extends through a slot 317 (best shown in FIGS. 4B, 6A, and 7) formed in the main body 312 of the mounting plate 310. Referring to FIG. 7, the slot 317 extends from the first surface 311A of the main body 312 of the mounting plate 310 into the slot 325 formed in the main body 312 adjacent to the second opposing end 315B of the mounting plate 310. Referring to FIG. 5A, the slot 317 has a generally oblong shape such that the first generally cylindrical post 374 is able to move and/or slide side-to-side within the slot 317 in addition to being able to rotate about the axis Z1 and/or the axis Z2 (FIGS. 9A and 9B).

Further, during operation of the floating roller guide assembly 300, the second generally cylindrical post 376 is positioned in a bore 227 (FIG. 4B) formed in the internal shelf 225 of the lift housing 220. As such, rotation of the first generally cylindrical post 374 causes a rotation of the second generally cylindrical post 376 about its axis Z2 in the bore 227. More specifically, because the bore 227 is a fixed relative reference point and because of the offset distance G between the axes Z1 and Z2, the rotation of the first generally cylindrical post 374 also results in the first generally cylindrical post 374 orbiting about the axis Z2 in a circular path. As the first generally cylindrical post 374 moves along the circular path, the first generally cylindrical post 374 also slides side-to-side within the slot 317 (FIG.

4B) and causes the mounting plate 310 to move back and forth in the direction of arrows B. More specifically, the rotation of the eccentric member 370 causes the projection 314 (FIG. 5B) of the mounting plate 314 to slide back and forth in the direction of arrows B within a channel 229 (FIG. 4B) formed in the internal shelf 225 of the lift housing 220.

After the eccentric member 370 is used to adjust a location of the mounting plate 310 within the channel 229, the floating roller guide assembly 300 is fixed to the internal shelf 225 of the lift housing 220 using the fasteners 395A, 395B. The first fastener 395A is positioned through a first fastener slot 319A (best shown in FIG. 4B) in the main body 312 of the mounting plate 310 and threadingly engages with a first threaded bore 228A formed in the internal shelf 225 of the lift housing 220. Similarly, the second fastener 395B is positioned through a second fastener slot 319B (best shown in FIG. 4B) in the main body 312 of the mounting plate 310 and threadingly engages with a second threaded bore 228B formed in the internal shelf 225 of the lift housing 220. Thus, the fasteners 395A, 395B can be used to selective lock and/or fix the position of the floating roller guide assembly 300 (and the floating roller guide 350) relative to the internal shelf 225 (FIG. 4A) and the drum 250 (FIG. 8).

The floating roller guide assembly 300 differs from some prior systems that used a threaded shaft extending off an end of the drum that threadingly engaged with a fixed threaded nut. Such prior systems required a rather long threaded shaft to impart the necessary translation to the drum. As such, the prior systems resulted in a relatively longer/bigger lift housing to house the threaded shaft and the fixed threaded nut components.

In some implementations of the present disclosure, use of the floating roller guide assembly 300 in the lift assembly 200 to impart translation to the drum 250, as opposed to a threaded shaft extending from an end of the drum 250 and threadingly engaging a fixed threaded nut, results in seed lifting and rotation system 100 with the main housing 222 (FIG. 3A) that is about 40% less in weight than a main housing of a standard seed lifting and rotating system that uses a threaded shaft and fixed threaded nut. For example, in some implementations, the main housing 222 weighs about 28 kilograms and the main housing of the standard system weights about 47 kilograms.

Further, in some such implementations, the main housing 222 has a depth of about 240 millimeters, a height of about 240 millimeters, and length of about 364 millimeters, compared to the standard system with a main housing having a depth of about 240 millimeters, a height of about 240 millimeters, and length of about 546 millimeters. That is, the main housing 222 of the present disclosure is about 33% less/shorter as the main housing 222 does not need room for a threaded shaft and a fixed threaded nut to cause translation of the drum 250.

Similarly, in some implementations of the present disclosure, the lift assembly 200 (FIG. 2A) weighs about 76 kilograms as compared to the lift assembly of the standard system that weighs about 110 kilograms. There are many advantages to having a lighter and smaller seed lifting and rotation system 100 as compared to the prior standard systems. For example, the seed lifting and rotation system 100 is less expensive to manufacture as compared to the prior standard systems. For another example, the lift assembly 200 of the seed lifting and rotation system 100 is relatively lighter than the lift assembly of the prior standard systems and as such, rotating the lift assembly 200 requires less force (e.g., by the rotate motor assembly 150).

The debris tray assembly 400 is removably coupled to the main housing 222 of the lift assembly 200 as generally shown in FIGS. 2A, 2B, 3A, 3B. Specifically, the debris tray assembly 400 is positioned through an opening 222A (FIG. 2B) in the main housing 222 such that a portion of the debris tray assembly 400 is positioned adjacent to (e.g., below) a portion of the drum 250 and/or the helical thread 255, which is best shown in FIG. 3B. The debris tray assembly 400 is coupled to the main housing 222 via one or more fasteners or the like.

Figure 10A:
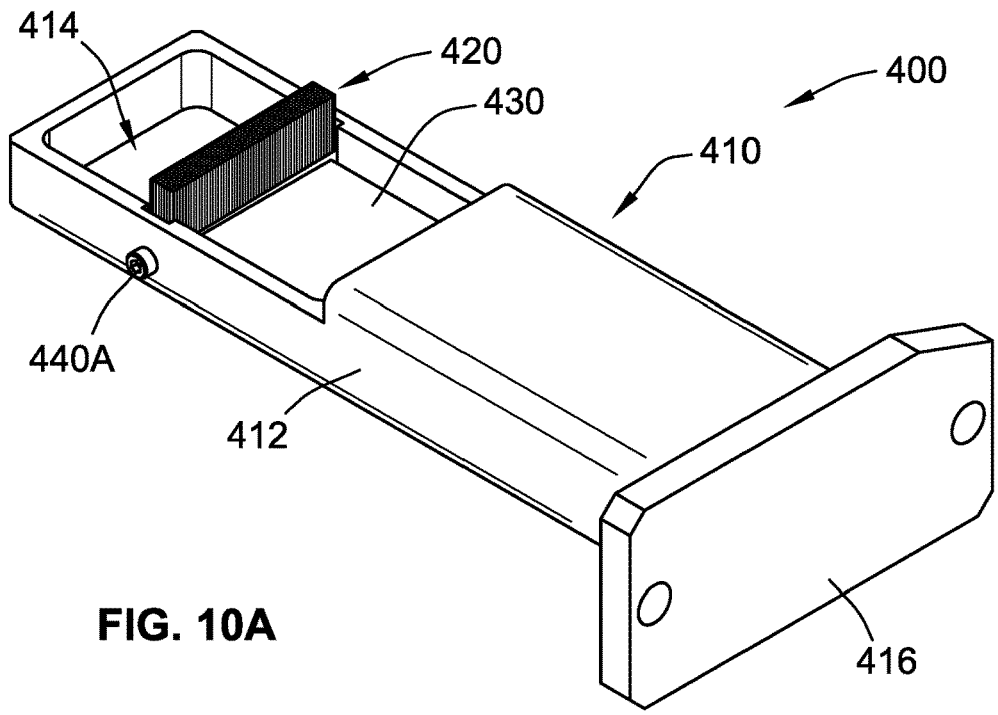
FIG. 10A is an assembled perspective view of a debris tray assembly of the lift assembly, according to some implementations of the present disclosure.
Figure 10B:
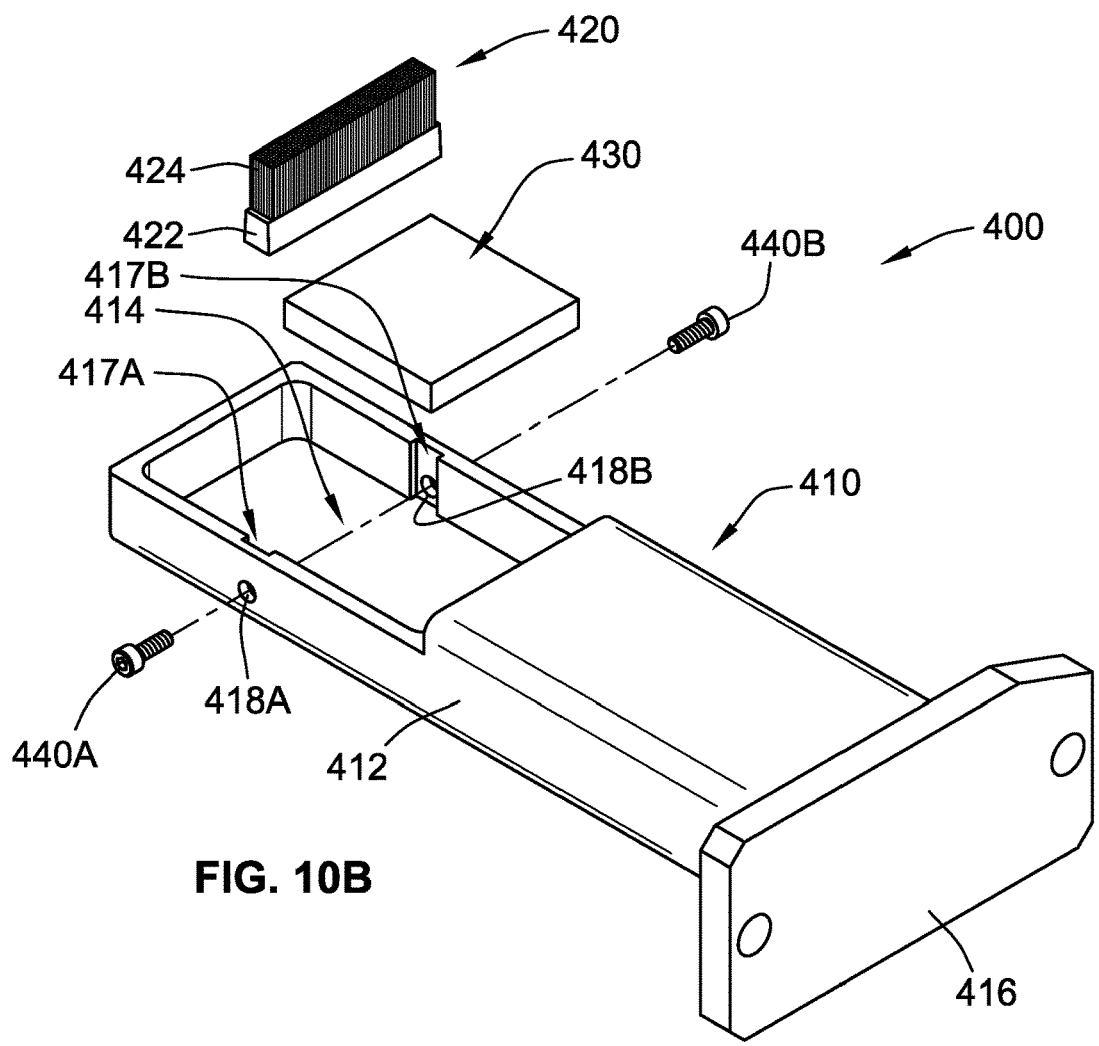
FIG. 10B is an exploded perspective view of the debris tray assembly of FIG. 10A.

Referring to FIGS. 10A and 10B, the debris tray assembly 400 includes a debris tray 410, a brush 420, and a magnet 430. The debris tray 410 has a main body 412 and a flanged front 416. The main body 412 forms a cavity 414. The cavity 414 is sized to receive therein the magnet 430 and a portion of the brush 420.

The main body 412 also forms slots 417A, 417B such that a body 422 of the brush 420 can slide into the slots 417A, 417B, thereby positioning a portion of the brush 420 in the cavity 414. With the body 422 of the brush 420 so positioned, fasteners 440A, 440B can be positioned through apertures 418A, 418B in the main body 412 of the debris tray 410 to removably secure the brush 420 to the debris tray 410.

The brush 420 also includes a plurality of bristles 424 that are coupled to and extend from the body 422 of the brush 420. With the debris tray assembly 400 coupled to the main housing 222, the brush 420 is positioned such that the plurality of bristles 424 extend towards the drum 250 and at least a portion of plurality of bristles 424 directly engage the drum 250 and/or the helical groove 255 as shown in FIG. 3B. As such, when the drum 250 rotates, the brush 420 rubs on and/or brushes the drum 250 to aid in causing debris, if any, on the drum 250 and/or in the helical groove 255 to be brushed off and collected in the cavity 414 and/or on/by the magnet 430.

The magnet 430 can be optionally included in the debris tray assembly 400 to aid in the collection of debris that is attracted to magnets (e.g., ferrous materials, iron, nickel, cobalt, etc., or any combination thereof). When included, the magnet 430 is positioned adjacent to the brush 420 such that as the brush 420 brushes the drum 250 and causes debris, if any, to be dislodged and fall, the magnet is strategically positioned to attract the debris and keep such debris from contaminating the growing crystal. In some implementations of the present disclosure, the drum 250 or a portion thereof and/or the cable 175 or a portion thereof is made of a material that is attracted to magnets. As such, if a portion of the drum 250 and/or the cable 175 flakes off, that portion can be attracted to and captured by the magnet 430 in the debris tray assembly 400.

As noted above, the lift assembly 200 (FIGS. 2A, 2B) includes an anti-binding feature that aids in preventing the drum 250 from binding with the main housing 222. Referring to FIG. 11, the anti-binding feature includes the two plates 510, 520 and the two anti-binding pins 530, 540.

Referring to FIG. 3A, the first plate 510 is coupled to a first side 221A of the lift housing 220 adjacent to and/or about the first opening 223A (shown in FIG. 2B). Similarly, the second plate 520 is coupled to a second opposing side 221B of the lift housing 220 adjacent to and/or about the second opening 223B (shown in FIG. 2B).

Figures 12A, 13A:
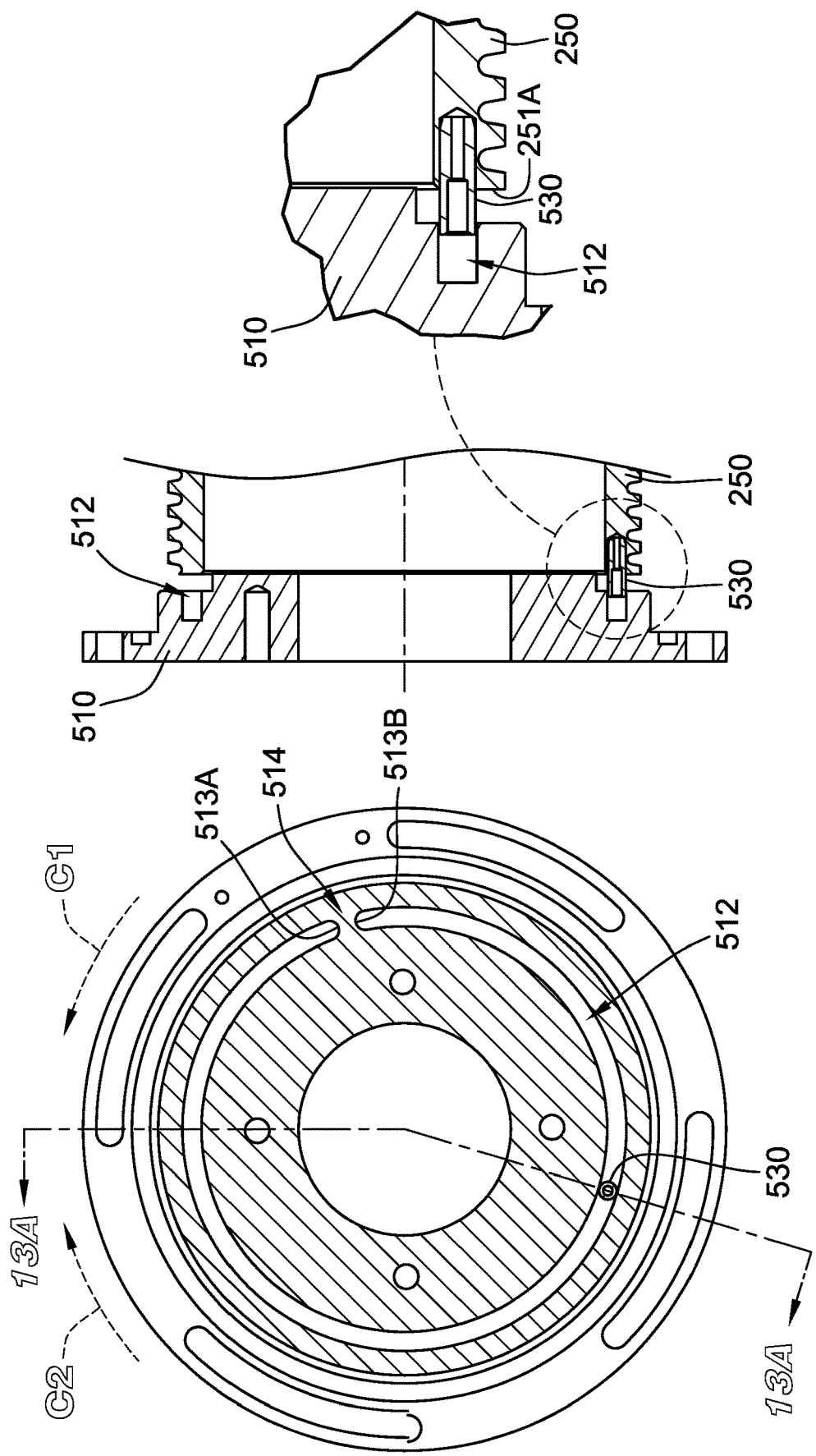
FIG. 12A is a cross-sectional view of a plate of the lift assembly having a groove with an anti-binding pin (coupled to the drum) positioned therein at a first circumferential position, according to some implementations of the present disclosure.
FIG. 13A is a cross-sectional view of the plate of FIG. 12A illustrating a gap between an end of the drum and the plate corresponding to the first circumferential position of the anti-binding pin, according to some implementations of the present disclosure.
Figures 12B, 13B:
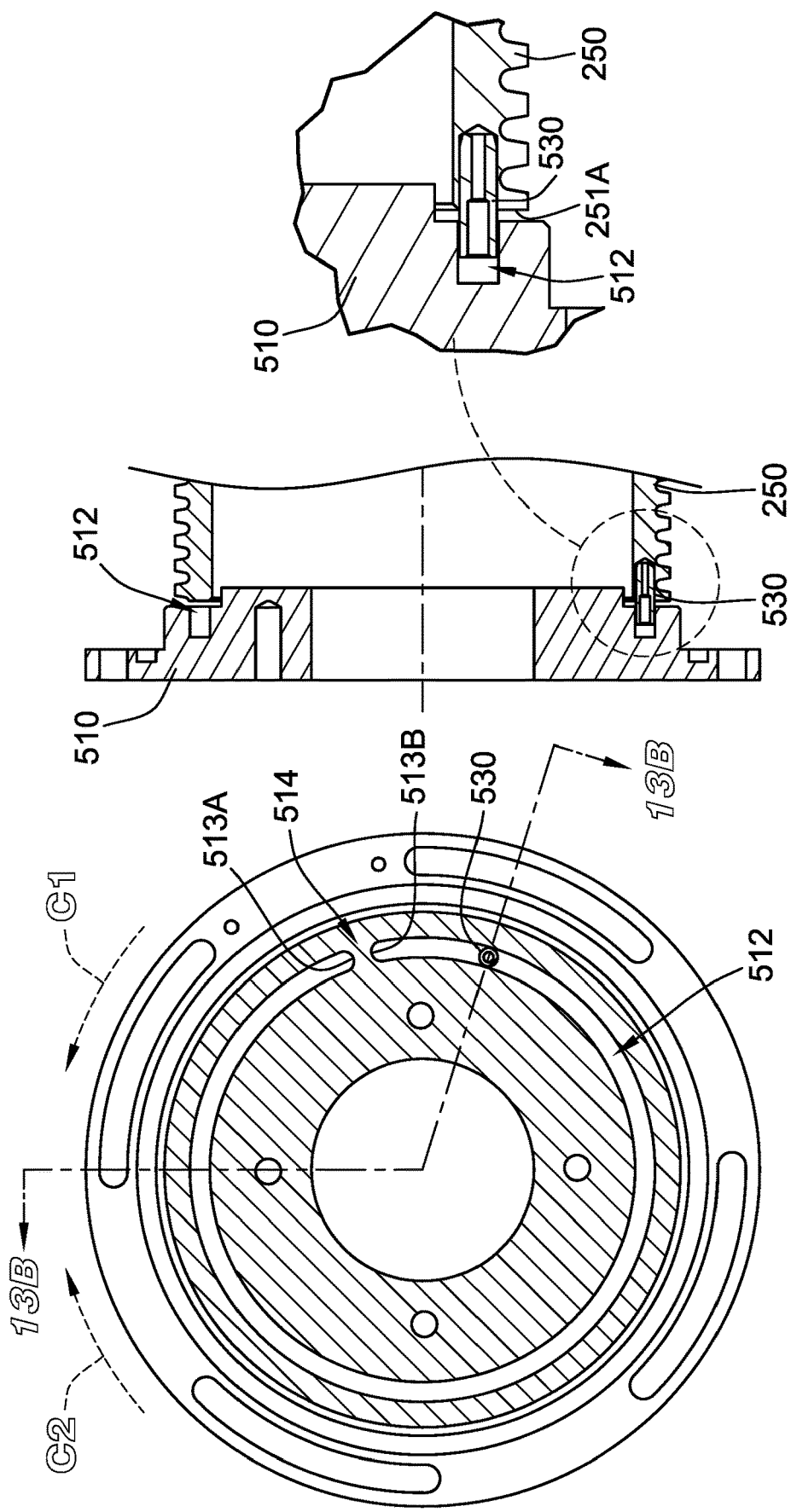
FIG. 12B is a cross-sectional view of the plate of FIG. 12A with the anti-binding pin (coupled to the drum) positioned therein at a second circumferential position illustrating movement of the anti-binding pin due to rotation of the drum.
FIG. 13B is a cross-sectional view of the plate of FIG. 12B illustrating the gap between an end of the drum and the plate corresponding to the second circumferential position of the anti-binding pin.

Referring to FIGS. 11 and 12A, an inner surface of the first plate 510 forms a first slot 512 therein. As best shown in FIG. 12A, the first slot 512 extends from a first point 513A in a first circumferential direction (defined by arrow C1) to a second point 513B. The first slot 512 does not extend from the first point 513A to the second point 513B in a second circumferential direction (defined by arrow C2) that is opposite the first circumferential direction. As such, the first slot 512 defines a stop 514 that is positioned between the first and second points 513A, 513B.

The second plate 520 (FIG. 11) is generally a duplicate of and/or a mirror image of the first plate 510. An inner surface of the second plate 520 forms a second slot 522 therein. The second slot 522 extends from a third point in the first circumferential direction (defined by arrow C1) to a fourth point. The second slot does not extend from the third point to the fourth point in the second circumferential direction (defined by arrow C2) that is opposite the first circumferential direction. As such, the second slot 522 defines a stop 524 that is positioned between the third and fourth points of the second plate 520.

Referring to FIG. 11, the first anti-binding pin 530 extends from the first end 251A of the drum 250. Similarly, the second anti-binding pin 540 extends from the second opposing end 251B of the drum 250. As the drum 250 translates or moves along the drive shaft 120 and/or the axis Y in the direction of arrow D1, the first anti-binding pin 530 is positioned to engage the first slot 512 in the first plate 510 to limit translation of the drum 250 in the direction of arrow D1. Similarly, as the drum 250 translates or moves along the drive shaft 120 and/or the axis Y in the direction of arrow D2, the second anti-binding pin 540 is positioned to engage the second slot 522 in the second plate 520 to limit translation of the drum 250 in the direction of arrow D2.

Referring generally to FIGS. 12A-12C and 13A-13C, a movement of the first anti-binding pin 530 within the first slot 512 is illustrated from a first circumferential position (FIGS. 12A and 13A), to a second circumferential position (FIGS. 12B and 13B), to a third circumferential position (FIGS. 12C and 13C) where the first anti-binding pin 530 engages the stop 514. As the drum 250 rotates in a first direction (e.g., clockwise), the engagement of the floating roller guide 350 with the helical groove 255 (as shown in FIG. 8) causes the drum 250 to translate along the axis Y in the direction of arrow D1. Continued translation of the drum 250 in the direction of arrow D1 results in the first anti-binding pin 530 entering the first slot 512 and moving therein in a circumferential direction until the first anti-binding pin 530 reaches the stop 514. As the first anti-binding pin 530 engages the stop 514, further translation of the drum 250 in the direction of arrow D1 is prevented.

As best shown in FIG. 13C, the translation of the drum 250 in the direction of arrow D1 is stopped prior to the first end 251A of the drum 250 reaching/touching the first plate 510, thereby preventing binding of the drum 250 with the first plate 510 and the lift housing 220. The space between the first end 251A of the drum 250 and the first plate 510 when the first anti-binding pin engages the stop 514 can be adjusted by moving the rotational position of the stop 514, by for example, rotating the first plate 510 and attaching the first plate 510 to the lift housing 220 in a different circumferential position. Additionally, the translation of the drum 250 in the direction of arrow D1 is stopped prior to the first anti-binding pin 530 reaching/touching the bottom of the first slot 512 as best shown in FIG. 13C.

Similar to how the first anti-binding pin 530 is described with reference to FIGS. 12A-12C and 13A-13C, movement of the second anti-binding pin 540 within the second slot 522 (FIG. 11) occurs until the second anti-binding pin 540 engages the stop 524 (FIG. 11) of the second plate 520. As the drum 250 rotates in a second direction (e.g., counterclockwise), the engagement of the floating roller guide 350 with the helical groove 255 (as shown in FIG. 8) causes the drum 250 to translate along the axis Y in the direction of arrow D2 (FIG. 11). Continued translation of the drum 250 in the direction of arrow D2 results in the second anti-binding pin 540 entering the second slot 522 and moving therein in a circumferential direction until the second anti-binding pin 540 reaches the stop 524 of the second plate 520. As the second anti-binding pin 540 engages the stop 524 of the second plate 520, further translation of the drum 250 in the direction of arrow D2 is prevented.

Each of these implementations and obvious variations thereof is contemplated as falling within the spirit and scope of the present disclosure, which is set forth in the following claims. Moreover, the present concepts expressly include any and all combinations and sub-combinations of the preceding elements and aspects. The present disclosure is not limited to the specific illustrated example but extends to alternative embodiments other shapes and/or configurations in accordance with the knowledge of one of ordinary skill in the art applied consistent with the presently disclosed principles.

What is claimed is:

1. A lift assembly for use in lifting a seed coupled to a cable, the assembly comprising:
   a lift housing forming a cable exit port therein;
   a drum positioned within the lift housing, the drum forming a helical groove about an exterior surface of the drum, the drum extending from a first end to a second opposing end;
   a floating roller guide assembly including:
      a mounting plate coupled to the lift housing and having a throughhole;
      a floating shaft coupled to the mounting plate such that the floating shaft is movable relative to the mounting plate in a direction that is generally perpendicular to a central axis of the floating shaft; and
      a floating roller guide rotationally coupled about the floating shaft and generally positioned within the throughhole of the mounting plate such that at least a portion of the floating roller guide is configured to engage at least a portion of the helical groove of the drum; and
   a drive shaft coupled to the drum and configured to cause (i) the drum to rotate and (ii) a translate via an engagement of the helical groove of the drum with the floating roller guide.

2. The lift assembly of claim 1, wherein the floating shaft has a first throughhole formed in a first end of the floating shaft and a second throughhole formed in a second opposing end of the floating shaft.

3. The lift assembly of claim 2, further comprising:
   a first bolt positioned through the first throughhole of the floating shaft and coupled to the mounting plate; and
   a second bolt positioned through the second throughhole of the floating shaft and coupled to the mounting plate.

4. The lift assembly of claim 3, further comprising:
   a first biasing member positioned about the first bolt and configured to bias the floating shaft in a biased direction; and
   a second biasing member positioned about the second bolt and configured to bias the floating shaft in the biased direction.

5. The lift assembly of claim 1, wherein the floating roller guide further includes an eccentric member, the eccentric member having a main body, a first generally cylindrical post extending from a first surface of the main body, and a second generally cylindrical post extending from a second opposing surface of the main body, a central axis of the first generally cylindrical post being offset from a central axis of the second generally cylindrical post.

6. The lift assembly of claim 5, wherein the first generally cylindrical post is positioned at least partially in a slot formed in the mounting plate, and wherein the second generally cylindrical post is positioned at least partially in a bore formed in the lift housing such that rotation of the first generally cylindrical post is configured to cause the mounting plate to move relative to the lift housing.

7. The lift assembly of claim 1, further comprising a debris tray coupled to the lift housing such that at least a portion of the debris tray is positioned adjacent to a portion of the helical groove of the drum.

8. The lift assembly of claim 7, further comprising a brush coupled to the debris tray such that at least a portion of a plurality of bristles of the brush directly engage the drum.

9. The lift assembly of claim 8, further comprising a magnet coupled to the debris tray adjacent to the brush, the magnet being configured to magnetically attract metal debris.

10. The lift assembly of claim 1, wherein the mounting plate has a main body and a projection, the main body having a first surface and second opposing surface, the projection extending from the second opposing surface of the main body adjacent to a first end of the main body, the throughhole being formed through the main body and the projection.

11. The lift assembly of claim 10, wherein the main body has a slot adjacent to a second opposing end of the main body, the slot extending from the second opposing surface of the main body towards the first surface of the main body.

12. The lift assembly of claim 1, wherein the floating roller guide includes a generally cylindrical body, a first wheel portion positioned about a first end of the generally cylindrical body, and a second wheel portion positioned about a second opposing end of the generally cylindrical body.

13. The lift assembly of claim 12, wherein the first wheel portion has an outer side-surface, an inner side-surface, and a perimeter surface, and the second wheel portion has an outer side-surface, an inner side-surface, and a perimeter surface, at least a portion of the inner side-surface of the first wheel portion being outwardly tapered from the perimeter surface of the first wheel portion towards the generally cylindrical body and at least a portion of the inner side-surface of the second wheel portion being outwardly tapered from the perimeter surface of the second wheel portion towards the generally cylindrical body.

14. A roller guide assembly for use in lifting a seed coupled to a cable, the roller guide assembly comprising:
a mounting plate having a throughhole;
a shaft coupled to the mounting plate such that the shaft is movable relative to the mounting plate in a direction that is generally perpendicular to a central axis of the shaft;
a roller guide rotationally coupled about the shaft and generally positioned within the throughhole of the mounting plate such that at least a portion of the roller guide extends out of the throughhole; and
an eccentric member having a main body, a first generally cylindrical post extending from a first surface of the main body, and a second generally cylindrical post extending from a second opposing surface of the main body, a central axis of the first generally cylindrical post being offset from a central axis of the second generally cylindrical post.

15. The roller guide assembly of claim 14, wherein the roller guide includes a generally cylindrical body, a first wheel portion positioned about a first end of the generally cylindrical body, and a second wheel portion positioned about a second opposing end of the generally cylindrical body, and wherein the first wheel portion has an outer side-surface, an inner side-surface, and a perimeter surface, and the second wheel portion has an outer side-surface, an inner side-surface, and a perimeter surface, at least a portion of the inner side-surface of the first wheel portion being outwardly tapered from the perimeter surface of the first wheel portion towards the generally cylindrical body and at least a portion of the inner side-surface of the second wheel portion being outwardly tapered from the perimeter surface of the second wheel portion towards the generally cylindrical body.

16. A lift assembly for use in lifting a seed coupled to a cable, the assembly comprising:
a lift housing;
a first plate coupled to a first side of the lift housing, an inner surface of the first plate forming a first slot therein;
a second plate coupled to a second opposing side of the lift housing, an inner surface of the second plate forming a second slot therein;
a drum positioned within the lift housing, the drum forming a helical groove about an exterior surface of the drum, the drum extending from a first end to a second opposing end;
a first anti-binding pin coupled to and extending from the first end of the drum and being configured to engage the first slot in the first plate to limit translation of the drum in a first linear direction; and
a second anti-binding pin coupled to and extending from the second opposing end of the drum and being configured to engage the second slot in the second plate to limit translation of the drum in a second linear direction that is opposite the first linear direction.

17. The lift assembly of claim 16, wherein the first slot extends from a first point in a first circumferential direction to a second point, the first slot not extending from the first point to the second point in a second circumferential direction that is opposite the first circumferential direction.

18. The lift assembly of claim 17, wherein the second slot extends from a third point in a third circumferential direction to a fourth point, the second slot not extending from the third point to the fourth point in a fourth circumferential direction that is opposite the third circumferential direction.

19. The lift assembly of claim 18, wherein the first and the third circumferential directions are the same and the second and the fourth circumferential directions are the same.

* * * * *